US012707983B2

(12) United States Patent
Hirao et al.

(10) Patent No.: US 12,707,983 B2

(45) Date of Patent: Aug. 11, 2026

(54) SEMICONDUCTOR DEVICE

(71) Applicant: FUJI ELECTRIC CO., LTD., Kawasaki (JP)

(72) Inventors: Akira Hirao, Matsumoto (JP); Yoshinari Ikeda, Matsumoto (JP); Motohito Hori, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 396 days.

(21) Appl. No.: 18/305,516

(22) Filed: Apr. 24, 2023

(65) Prior Publication Data

US 2023/0411313 A1 Dec. 21, 2023

(30) Foreign Application Priority Data

Jun. 15, 2022 (JP) ................................ 2022-096388

(51) Int. Cl.

| | |
|---|---|
| ***H01L 23/64*** | (2006.01) |
| ***H01L 23/00*** | (2006.01) |
| ***H01L 25/065*** | (2023.01) |
| ***H05K 1/18*** | (2006.01) |
| ***H05K 1/183*** | (2026.01) |

(52) U.S. Cl.

CPC ............ *H01L 23/647* (2013.01); *H01L 24/16* (2013.01); *H01L 24/32* (2013.01); *H01L 24/73* (2013.01); *H01L 25/0655* (2013.01); *H05K 1/183* (2013.01); *H01L 2224/16225* (2013.01); *H01L 2224/32245* (2013.01);

(Continued)

(58) Field of Classification Search

CPC ........ H02M 1/348; H02M 1/34; H02M 1/342; H02M 1/346; H02M 1/344; H01L 23/64; H01L 23/647; H01L 2224/16225; H01L 2224/32245; H01L 2224/73253; H01L 24/16; H01L 24/32; H01L 24/73; H01L 2924/10272; H01L 2924/1033; H01L 25/0655; H01L 25/072; H05K 1/183;

(Continued)

(56) References Cited

U.S. PATENT DOCUMENTS

| | | | |
|---|---|---|---|
| 10,566,966 | B2 | 2/2020 | Matsuda et al. |
| 11,069,621 | B2 | 7/2021 | Nakano |

(Continued)

FOREIGN PATENT DOCUMENTS

| | | |
|---|---|---|
| JP | 2014089225 A * | 5/2014 |
| JP | 2014-187874 A | 10/2014 |

(Continued)

OTHER PUBLICATIONS

Japanese Office Action issued in counterpart Japanese Application No. 2022-096388 dated Apr. 21, 2026.

*Primary Examiner* — Lawrence C Tynes, Jr.

(57) ABSTRACT

A semiconductor device includes: an insulated circuit substrate; a semiconductor chip provided on the insulated circuit substrate; a first external connection terminal provided on the insulated circuit substrate; a relay terminal provided on the insulated circuit substrate; a printed circuit board arranged over the semiconductor chip and connected to the first external connection terminal and the relay terminal; and a first snubber circuit provided on the printed circuit board and having one end connected to the first external connection terminal via the printed circuit board and another end connected to the relay terminal via the printed circuit board.

17 Claims, 16 Drawing Sheets

(52) U.S. Cl.
CPC ............... *H01L 2224/73253* (2013.01); *H01L 2924/10272* (2013.01); *H01L 2924/1033* (2013.01); *H05K 2201/10015* (2013.01); *H05K 2201/10022* (2013.01)

(58) Field of Classification Search
CPC .......... H05K 1/184; H05K 1/182; H05K 1/18; H05K 2201/10015; H05K 2201/10022
See application file for complete search history.

(56) References Cited

U.S. PATENT DOCUMENTS

| | | | | |
|---|---|---|---|---|
| 11,322,436 | B2 | 5/2022 | Nakano | |
| 2013/0258736 | A1 | 10/2013 | Higuchi et al. | |
| 2018/0309438 | A1 | 10/2018 | Matsuda et al. | |
| 2020/0006237 | A1 * | 1/2020 | Nakano | H10D 1/68 |
| 2020/0395867 | A1 | 12/2020 | Horiguchi et al. | |
| 2021/0143147 | A1 | 5/2021 | Nakano | |

FOREIGN PATENT DOCUMENTS

| | | | | | |
|---|---|---|---|---|---|
| JP | 6196931 | B2 | | 9/2017 | |
| JP | 6202094 | B2 | * | 9/2017 | H01L 24/32 |
| JP | 2018-116962 | A | | 7/2018 | |
| JP | 6597902 | B2 | | 10/2019 | |
| JP | 6602260 | B2 | | 11/2019 | |
| JP | 2020004929 | A | * | 1/2020 | H01L 23/5385 |
| JP | 2021005690 | A | * | 1/2021 | |
| JP | 2021-077764 | A | | 5/2021 | |
| JP | 2022-022521 | A | | 2/2022 | |
| WO | 2019/163205 | A1 | | 8/2019 | |

* cited by examiner 6
1
67
66b
65
61
62
63b
64
12b
11
13
X
Z
Y
10
9
9
3c
2c
43e
46c
45c
43c
4c
23
83c
22
22
9
81
81
21
21
46a
82a
83a
41c
45
41e
4a
67
66c
9
9
63c
64
3a
2a
12a 6
62
44d
44e
63g
43d
43e
3c
X
Y
Z
63i
3d
44a
44b
44c
63b
63f
43c
43b
43a
22
63a
42c
42b
42a
3b
63h
41a
41b
41c
21
63c
63d
42d
42e
63e
81
41d
41e
3a

SEMICONDUCTOR DEVICE

CROSS-REFERENCE TO RELATED APPLICATION

This application claims benefit of priority under 35 USC 119 based on Japanese Patent Application No. 2022-096388 filed on Jun. 15, 2022, the entire contents of which are incorporated by reference herein.

BACKGROUND OF THE INVENTION

1. Field of the Invention

The present invention relates to a semiconductor device such as a power semiconductor device equipped with a power semiconductor element.

2. Description of the Related Art

Development of power semiconductor devices (simply referred to below as "semiconductor devices") has grown that are equipped with a next-generation power semiconductor element including silicon carbide (SiC), gallium nitride (GaN), or gallium oxide ($Ga_2O_3$), for example. Such a power semiconductor element has higher dielectric breakdown field intensity than conventional power semiconductor elements including silicon (Si) and thus has a high breakdown voltage, and can be led to have a higher impurity concentration and a smaller thickness of an active layer than the conventional power semiconductor elements, so as to be favorably used for a semiconductor device having a small size while achieving a high efficiency and a high-speed operation.

A power conversion device equipped with the semiconductor device as described above converts input DC power to AC power or converts input AC power to DC power by a switching operation of the power semiconductor element. A surge voltage or ringing may be caused upon the switching operation of the power semiconductor device because of a sudden change of a current and a parasitic inductance of a main circuit wire (a round of a parasitic inductance from the power semiconductor element through a main circuit capacitor), and thus may cause damage to the power semiconductor element.

To deal with this, a method is applied for such a power conversion device that absorbs energy accumulated in the parasitic inductance of the main circuit wire so as to decrease the surge voltage, ringing, or noise such that a snubber circuit implemented only by a capacitor or by a combination of a resistor and a capacitor is connected parallel to the power semiconductor element.

JP 6602260 B discloses a power conversion device including a first substrate on which a switching element is mounted, a second substrate provided over the first substrate, and a snubber circuit including a capacitor and provided on the second substrate. JP 2022-22521 A discloses a semiconductor device including an insulated circuit substrate equipped with a semiconductor chip, and a printed circuit board provided over the insulated circuit substrate, in which the insulated circuit substrate and the printed circuit board are connected together via an interposer.

JP 6597902 B discloses a semiconductor device including a substrate equipped with a semiconductor element, and an additional substrate provided over the substrate, in which a resistive element and a capacitor implementing an oscillation-suppression circuit are provided on the additional substrate. JP 2014-187874 A discloses a power conversion device including an insulated substrate equipped with a transistor element, and a capacitor for suppressing a surge voltage provided on the insulated substrate.

WO 2019/163205 A1 discloses a power semiconductor module that detects a temperature of a snubber resistor by use of a temperature detector, and outputs a voltage relating to the temperature of the snubber resistor to a driving device for driving the power semiconductor device. JP2018-116962 A discloses a semiconductor device including a substrate equipped with a semiconductor element, and a wiring substrate provided over the substrate, in which a resistive element and a capacitive element implementing a voltage oscillation-suppression circuit are provided on the wiring substrate.

JP2020-4929 A discloses a semiconductor device including a stacked circuit substrate equipped with a semiconductor chip, and a power substrate provided over the stacked circuit substrate, in which a capacitor and a resistor implementing a CR snubber circuit are provided on the power substrate.

JP 6196931 B discloses a module including a snubber circuit implemented by a stacked body of a graphite sheet, a capacitor, and a graphite sheet stacked together.

The semiconductor devices described above equipped with such a conventional snubber circuit have a problem of a decrease in reliability because of heat generation in the power semiconductor element or have a problem of a decrease in the snubbing effects derived from an elongation of wires.

SUMMARY OF THE INVENTION

In view of the foregoing problems, the present invention provides a semiconductor device equipped with a snubber circuit having a configuration that can avoid a decrease in reliability caused by heat generation in a power semiconductor element and can also avoid a decrease in snubbing effect derived from an elongation of wires.

An aspect of the present invention inheres in a semiconductor device including: an insulated circuit substrate; one or more semiconductor chips provided on the insulated circuit substrate; a first external connection terminal provided on the insulated circuit substrate; a relay terminal provided on the insulated circuit substrate; a printed circuit board arranged over the one or more semiconductor chips and connected to the first external connection terminal and the relay terminal; and a first snubber circuit provided on the printed circuit board and having one end connected to the first external connection terminal via the printed circuit board and another end connected to the relay terminal via the printed circuit board.

Another aspect of the present invention inheres in a method of a semiconductor device including: an insulated circuit substrate; a semiconductor chip provided on the insulated circuit substrate; a first external connection terminal provided on the insulated circuit substrate; a printed circuit board arranged over the semiconductor chip and connected to the first external connection terminal; a second external connection terminal provided on the printed circuit board; and a snubber circuit provided on the printed circuit board and having one end connected to the first external connection terminal via the printed circuit board and another end connected to the second external connection terminal via the printed circuit board.

DETAILED DESCRIPTION

Figure 1:
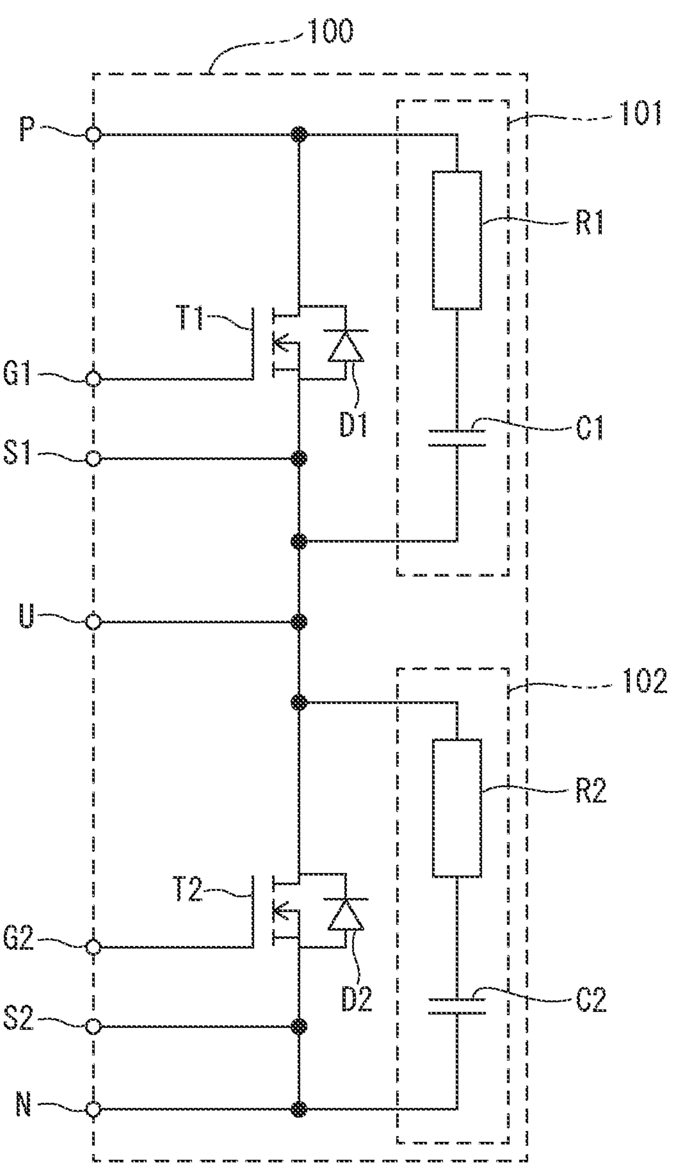
FIG. 1 is an equivalent circuit diagram of a semiconductor device according to a first embodiment.

With reference to the Drawings, first to sixth embodiments of the present invention will be described below.

In the Drawings, the same or similar elements are indicated by the same or similar reference numerals. The Drawings are schematic, and it should be noted that the relationship between thickness and planer dimensions, the thickness proportion of each layer, and the like are different from real ones. Moreover, in some drawings, portions are illustrated with different dimensional relationships and proportions. The first to sixth embodiments described below merely illustrate schematically devices and methods for specifying and giving shapes to the technical idea of the present invention, and the span of the technical idea is not limited to materials, shapes, structures, and relative positions of elements described herein.

In the embodiment, a "first main electrode" is assigned to any one of an emitter electrode or a collector electrode in an insulated-gate bipolar transistor (IGBT). The first main electrode is assigned to any one of a source electrode or a drain electrode in a field-effect transistor (FET) or a static induction transistor (SIT). The first main electrode is assigned to any one of an anode electrode or a cathode electrode in a static induction (SI) thyristor, a gate turn-off (GTO) thyristor or a diode. A "second main electrode" is assigned to any one of the emitter electrode or the collector electrode in the IGBT, which is not assigned as the first main electrode. The second main electrode is assigned to any one of the source electrode or the drain electrode in the FET or the SIT, which is not assigned as the first main electrode. The second main electrode is assigned to any one of the anode electrode or the cathode electrode in the SI thyristor, the GTO thyristor or the diode, which is not assigned as the first main electrode. That is, when the "first main electrode" is the source electrode, the "second main electrode" means the drain electrode. When the "first main electrode" is the emitter electrode, the "second main electrode" means the collector electrode. When the "first main electrode" is the anode electrode, the "second main electrode" means the cathode electrode.

Additionally, definitions of directions such as "upper", "lower", "upper and lower", "left", "right", and "left and right" in the following description are simply definitions for convenience of description, and do not limit the technological concept of the present invention. For example, when observing an object rotated by 90 degrees, the "upper and lower" are converted to "left and right" to be read, and when observing an object rotated by 180 degrees, the "upper and lower" are read reversed, which should go without saying.

First Embodiment

A semiconductor device according to a first embodiment includes a MOS transistor T1 that is a power semiconductor element serving as an upper arm and a MOS transistor T2 serving as a lower arm so as to implement a part of a three-phase bridge circuit. A freewheeling diode (FWD) D1 is connected antiparallel to the MOS transistor T1. A drain of the MOS transistor T1 is connected to a positive-electrode terminal P, and a gate of the MOS transistor T1 is connected to a gate terminal G1. A source of the MOS transistor T1 is connected to an auxiliary source terminal (a sensing terminal) S1 and an output terminal U.

A snubber circuit 101 is connected parallel to and between the drain and the source of the MOS transistor T1. The snubber circuit 101 includes a resistor R1 and a capacitor C1. One end of the resistor R1 is connected to the drain of the MOS transistor T1, and the other end of the resistor R1 is connected to one end of the capacitor C1. The other end of the capacitor C1 is connected to the source of the MOS transistor T1.

A freewheeling diode (FWD) D2 is connected antiparallel to the MOS transistor T2. A source of the MOS transistor T2 is connected to a negative-electrode terminal N and an auxiliary source terminal (a sensing terminal) S2, and a gate of the MOS transistor T2 is connected to a gate terminal G2. A drain of the MOS transistor T2 is connected to an output terminal U.

A snubber circuit 102 is connected parallel to and between the drain and the source of the MOS transistor T2. The snubber circuit 102 includes a resistor R2 and a capacitor C2. One end of the resistor R2 is connected to the drain of the MOS transistor T2, and the other end of the resistor R2 is connected to one end of the capacitor C2. The other end of the capacitor C2 is connected to the source of the MOS transistor T2.

Figure 2:
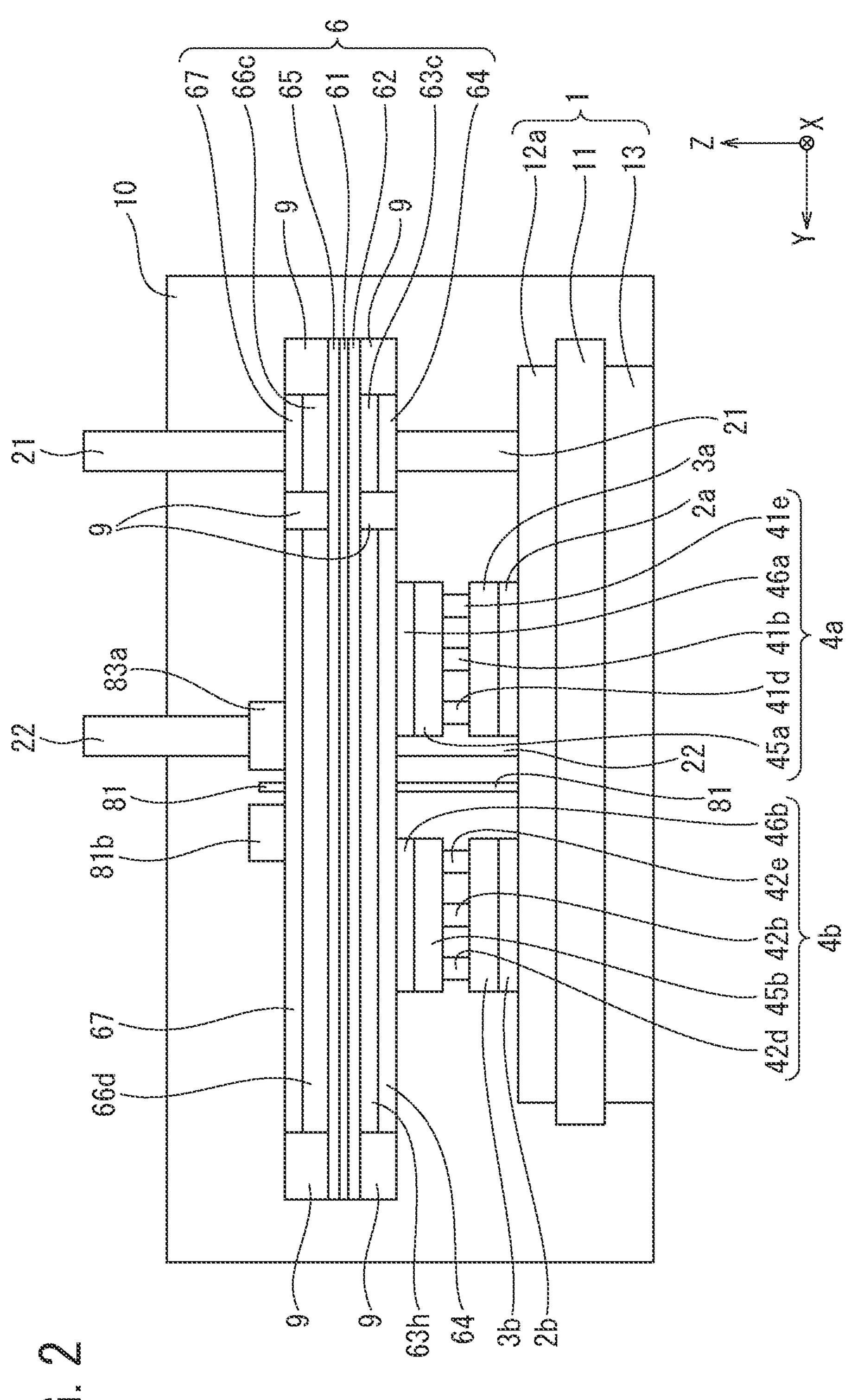
FIG. 2 is a side view illustrating the semiconductor device according to the first embodiment.

FIG. 2 is a schematic side view illustrating the semiconductor device according to the first embodiment. The right-left direction in the side view in FIG. 2 is defined as a Y axis, and the left direction in FIG. 2 is defined as a positive direction of the Y axis. The direction orthogonal to the Y axis that is the backward-frontward direction in the sheet of FIG. 2 is defined as an X axis, and the backward side in FIG. 2 is defined as a positive direction of the X axis. The direction orthogonal to the X axis and the Y axis that is the upper-lower direction in FIG. 2 is defined as a Z axis, and the upper direction in FIG. 2 is defined as a positive direction of the Z axis. The respective definitions regarding the X axis, the Y axis, and the Z axis are also applied to the following explanations for the plan views and the side views of the subsequent drawings explained after FIG. 2.

Figure 3:
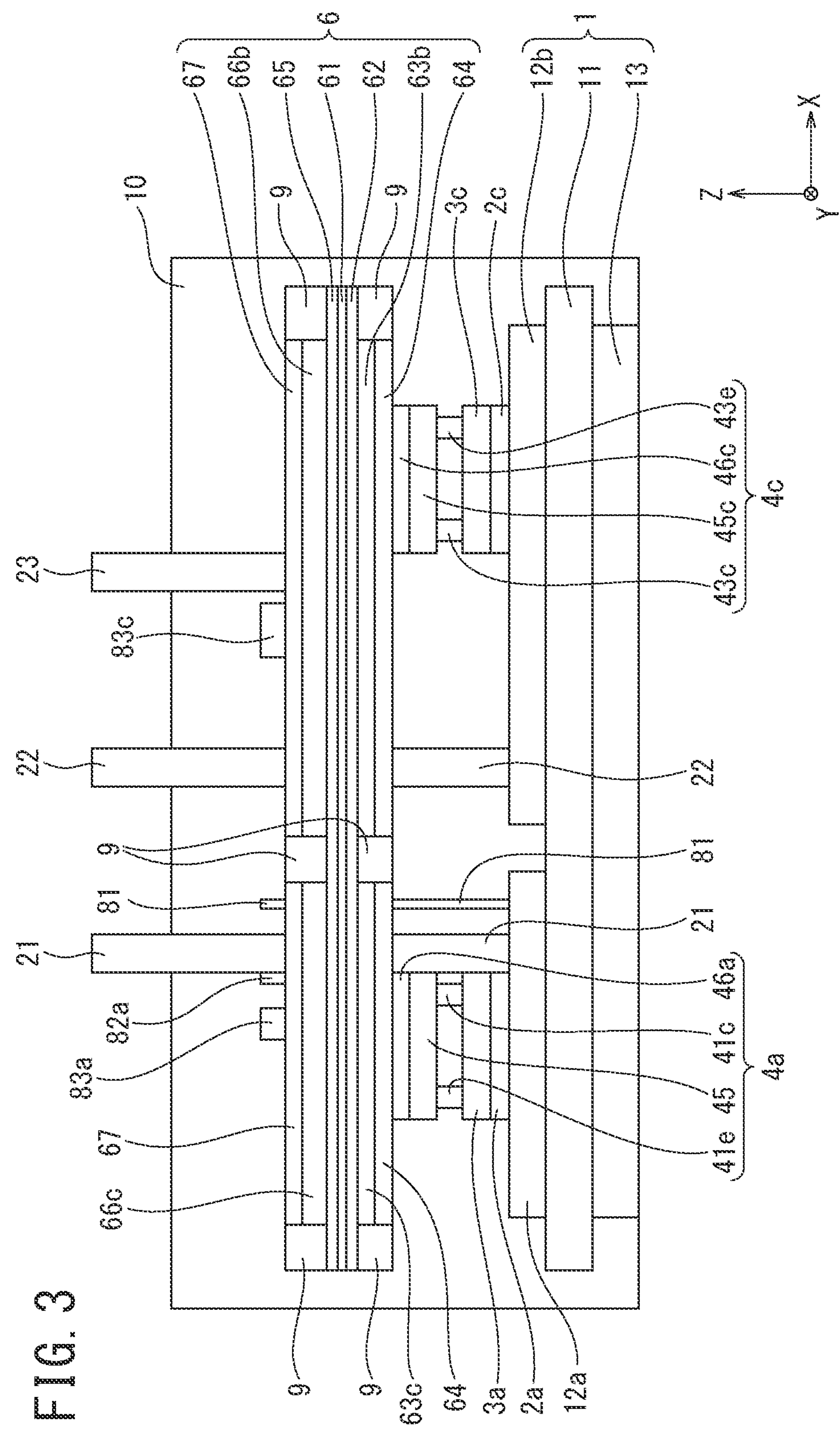
FIG. 3 is another side view illustrating the semiconductor device according to the first embodiment.
Figure 4:
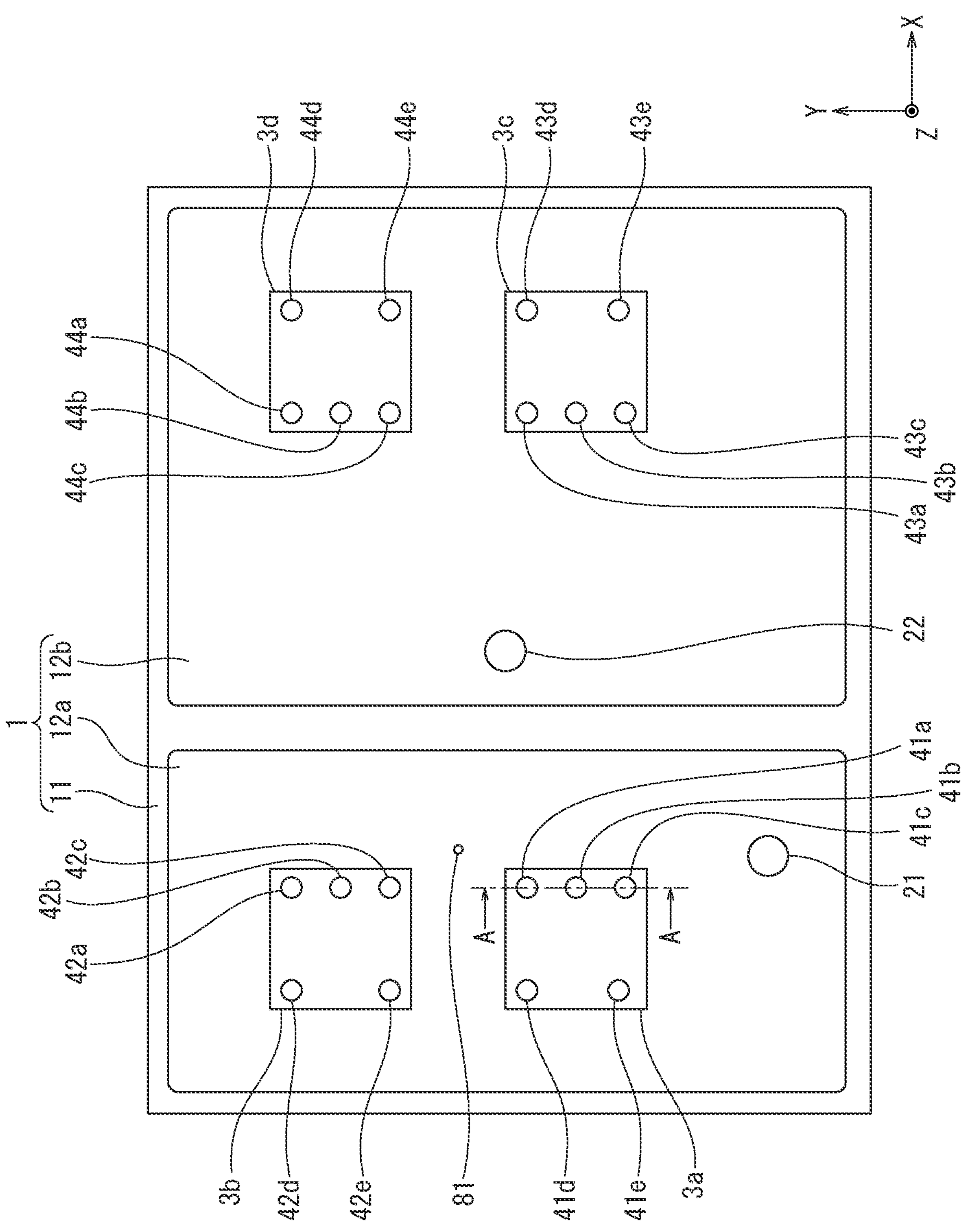
FIG. 4 is a plan view illustrating an insulated circuit substrate and semiconductor chips according to the first embodiment.

FIG. 2 is the schematic side view illustrating the semiconductor device according to the first embodiment as viewed in the positive direction of the X axis. FIG. 3 is a schematic side view illustrating the semiconductor device according to the first embodiment as viewed in the positive direction of the Y axis. FIG. 4 is a plan view illustrating an insulated circuit substrate 1 and semiconductor chips 3*a* to 3*d* each implementing a part of the semiconductor device according to the first embodiment.

The semiconductor device according to the first embodiment is a “2-in-1” semiconductor module having functions for two power semiconductor elements. As illustrated in FIG. 2 to FIG. 4, the semiconductor device according to the first embodiment includes the insulated circuit substrate 1, and the semiconductor chips 3*a* to 3*d* mounted on the insulated circuit substrate 1 via bonding members 2*a* to 2*c*.

The insulated circuit substrate 1 is a direct copper bonded (DCB) substrate or an active metal brazed (AMB) substrate, for example. The insulated circuit substrate 1 includes an insulating substrate 11, upper conductor layers (conductive plates) 12*a* and 12*b* deposited on the top surface of the insulating substrate 11, and a lower conductor layer (a heat-releasing plate) 13 deposited on the bottom surface of the insulating substrate 11. The upper conductor layers 12*a* and 12*b* are deposited to be separated from each other. The upper conductor layer 12*a* serves as a high-potential-side region, and the other upper conductor layer 12*b* serves as a low-potential-side region.

The insulating substrate 11 is a ceramic substrate made from aluminum oxide ($Al_2O_3$), aluminum nitride (AlN), silicon nitride ($Si_3N_4$), or boron nitride (BN), or a resin insulating substrate including polymer material, for example. The upper conductor layers 12*a* and 12*b* and the lower conductor layer 13 are each conductive foil made from copper (Cu) or aluminum (Al), for example.

The semiconductor chips 3*a* and 3*b* are bonded onto the upper conductor layer 12*a* via the bonding members 2*a* and 2*b*. The semiconductor chip 3*c* is bonded onto the upper conductor layer 12*b* via the bonding member 2*c*. The semiconductor chip 3*d* is bonded onto the upper conductor layer 12*b* via a boning member (not illustrated). The respective bonding members 2*a* to 2*c* are formed of solder or sintered material, for example. The respective semiconductor chips 3*a* to 3*d* may be directly bonded onto the corresponding upper conductor layers 12*a* and 12*b* by use of direct bonding means without the bonding members 2*a* to 2*c* interposed.

The semiconductor chips 3*a* and 3*b* illustrated in FIG. 2 to FIG. 4 correspond to the MOS transistor T1 implementing the upper arm illustrated in FIG. 1, and the semiconductor chips 3*c* and 3*d* illustrated in FIG. 2 to FIG. 4 correspond to the MOS transistor T2 implementing the lower arm illustrated in FIG. 1. The respective semiconductor chips 3*a* and 3*b* implementing the upper arm are arranged in parallel in the Y-axis direction. The respective semiconductor chips 3*c* and 3*d* implementing the lower arm are arranged in parallel in the Y-axis direction. The number of the semiconductor chips implementing the respective MOS transistors T1 and T2 illustrated in FIG. 1 is not limited to that as described above, but can be determined as appropriate depending on a rated current, for example.

The semiconductor chips 3*a* to 3*d* to be used each can be a power semiconductor element such as a field-effect transistor (FET), an insulated gate bipolar transistor (IGBT), a static induction (SI) thyristor, and a gate turn-off (GTO) thyristor, or a rectifying element such as a freewheeling diode (FWD), for example, while the type to be used depends on its intended purpose. The respective semiconductor chips 3*a* to 3*d* may be implemented by a silicon (Si) substrate, or may be implemented by a wide-bandgap semiconductor substrate made from silicon carbide (SiC), gallium nitride (GaN), or gallium oxide ($Ga_2O_3$), for example.

The first embodiment is illustrated with the semiconductor device including the semiconductor chips 3*a* to 3*d* that are each a MOSFET. The respective semiconductor chips 3*a* to 3*d* include a first main electrode (a source electrode) and a control electrode (a gate electrode) on the top-surface side, and include a second main electrode (a drain electrode) on the bottom-surface side.

As illustrated in FIG. 2 and FIG. 3, interposers 4*a* to 4*c* are deposited on the respective top surfaces of the semiconductor chips 3*a* to 3*c*. Although not illustrated, another interposer similar to the interposers 4*a* to 4*c* is also deposited on the semiconductor chip 3*d*. The interposers 4*a* to 4*c* and the other interposer are configured to electrically connect the respective semiconductor chips 3*a* to 3*d* with a printed circuit board 6 described below. The means of electrically connecting the respective semiconductor chips 3*a* to 3*d* with the printed circuit board 6 is not limited to the interposers 4*a* to 4*c* and the like, and any other means may be used as appropriate.

FIG. 4 is a plan view illustrating post electrodes (bumps) 41*a* to 41*e* each implementing a part of the interposer 4*a* deposited on the top surface of the semiconductor chip 3*a*, post electrodes (bumps) 42*a* to 42*e* each implementing a part of the interposer 4*b* deposited on the top surface of the semiconductor chip 3*b*, post electrodes (bumps) 43*a* to 43*e* each implementing a part of the interposer 4*c* deposited on the top surface of the semiconductor chip 3*c*, and post electrodes (bumps) 44*a* to 44*e* each implementing a part of the interposer (not illustrated) deposited on the top surface of the semiconductor chip 3*d*. The respective interposers 41*a* to 41*e*, 42*a* to 42*e*, 43*a* to 43*e*, and 44*a* to 44*e* have a stick-like (a pin-like) or columnar shape, and in particular, can be a round column, a cylindroid, or a polygonal column such as a triangular column or a quadrangular column, for example.

The lower ends of the post electrodes 41*a* to 41*d* are bonded to the source electrode of the semiconductor chip 3*a* via a bonding member (not illustrated) such as solder or sintered material. The lower end of the post electrode 41*e* is bonded to the gate electrode of the semiconductor chip 3*a* via a bonding member (not illustrated) such as solder or sintered material.

The lower ends of the post electrodes 42*a* to 42*d* are bonded to the source electrode of the semiconductor chip 3*b* via a bonding member (not illustrated) such as solder or sintered material. The lower end of the post electrode 42*e* is bonded to the gate electrode of the semiconductor chip 3*b* via a bonding member (not illustrated) such as solder or sintered material.

The lower ends of the post electrodes 43*a* to 43*d* are bonded to the source electrode of the semiconductor chip 3*c* via a bonding member (not illustrated) such as solder or sintered material. The lower end of the post electrode 43*e* is bonded to the gate electrode of the semiconductor chip 3*c* via a bonding member (not illustrated) such as solder or sintered material.

The lower ends of the post electrodes 44*a* to 44*d* are bonded to the source electrode of the semiconductor chip 3*d* via a bonding member (not illustrated) such as solder or sintered material. The lower end of the post electrode 44*e* is bonded to the gate electrode of the semiconductor chip 3*d* via a bonding member (not illustrated) such as solder or sintered material.

Figure 5:
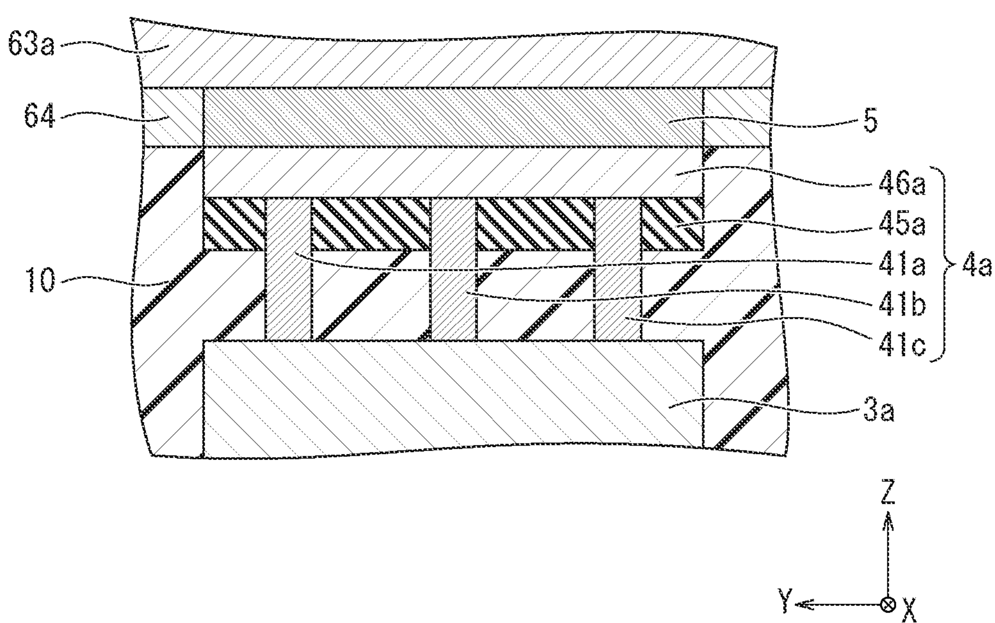
FIG. 5 is a cross-sectional view illustrating interposers as viewed from direction A-A in FIG. 4.

FIG. 5 is a cross-sectional view illustrating the interposer 4*a* taken along line A-A in FIG. 4. As illustrated in FIG. 2 to FIG. 5, the interposer 4*a* includes an insulating layer 45*a*, a conductive layer 46*a* deposited on the top surface of the insulating layer 45*a*, and the post electrodes 41*a* to 41*e* with the upper ends penetrating the insulating layer 45*a* and connected to the bottom surface of the conductive layer 46*a* via a bonding member (not illustrated) such as solder or sintered material.

The material to be used for the insulating layer 45*a* can be resin such as polyimide, for example. The material to be used for the conductive layer 46*a* can be metallic material such as copper (Cu), for example. The conductive layer 46*a* includes a part connected to the post electrodes 41*a* to 41*d* and a part connected to the post electrode 41*e* so as to be separated at the respective parts. The part of the conductive layer 46*a* connected to the post electrodes 41*a* to 41*d* is bonded to a lower wiring layer 63*a* of the printed circuit board 6 described below via a bonding member 5 such as solder or sintered material.

As illustrated in FIG. 2 and FIG. 4, the interposer 4*b* includes an insulating layer a conductive layer 46*b* deposited on the top surface of the insulating layer 45*b*, and the post electrodes 42*a* to 42*e* with the upper ends penetrating the insulating layer 45*b* and connected to the bottom surface of the conductive layer 46*b* via a bonding member (not illustrated) such as solder or sintered material.

As illustrated in FIG. 3 and FIG. 4, the interposer 4*c* includes an insulating layer a conductive layer 46*c* deposited on the top surface of the insulating layer 45*c*, and the post electrodes 43*a* to 43*e* with the upper ends penetrating the insulating layer 45*c* and connected to the bottom surface of the conductive layer 46*c* via a bonding member (not illustrated) such as solder or sintered material.

As illustrated in FIG. 2 and FIG. 3, the printed circuit board 6 is provided over the semiconductor chips 3*a* to 3*d* via the interposers 4*a* to 4*c* and the like. The printed circuit board 6 includes a carbon layer 61, an upper insulating layer 65 deposited on the top surface of the carbon layer 61, upper wiring layers 66*b*, 66*c*, and 66*d* deposited on the top surface of the upper insulating layer 65, a lower insulating layer 62 deposited on the bottom surface of the carbon layer 61, and lower wiring layers 63*b*, 63*c*, and 63*h* deposited on the bottom surface of the lower insulating layer 62. A carbon layer 64 is deposited on the respective bottom surfaces of the lower wiring layers 63*b*, 63*c*, and 63*h* so as to cover the lower wiring layers 63*b*, 63*c*, and 63*h*. Another carbon layer 67 is deposited on the respective top surfaces of the upper wiring layers 66*b*, 66*c*, and 66*d* so as to cover the upper wiring layers 66*b*, 66*c*, and 66*d*.

While FIG. 2 and FIG. 3 illustrate the case in which the respective ends of the carbon layer 61 conform to the respective ends of the upper insulating layer 65 and the lower insulating layer 62, the respective ends of the carbon layer 61 may be located on the inner side of the respective ends of the upper insulating layer 65 and the lower insulating layer 62. The upper insulating layer 65 and the lower insulating layer 62 may be integrally provided to cover the entire carbon layer 61 so that the carbon layer 61 is buried inside. Alternatively, any other insulating layers may be further provided so as to cover the respective ends of the carbon layer 61.

The carbon layers 61, 64, and 67 have thermal conductivity higher than thermal conductivity of the upper wiring layers 66*b*, 66*c*, and 66*d* and the lower wiring layers 63*b*, 63*c*, and 63*h* (about 400 W/mK which is thermal conductivity of copper, for example). The respective carbon layers 61, 64, and 67 to be used can be graphite in a sheet state (a graphite sheet) or graphene in a sheet state (a graphene sheet). The graphene is a sheet-like substance having a single-atom layer in which carbon atoms are bonded together, and the graphite has a structure including a plurality of graphene sheets stacked together. The graphite or the graphene has anisotropy with regard to the thermal conductivity. When the graphite or the graphene is used for the respective carbon layers 61, 64, and 67, the use of the material with the higher thermal conductivity in the in-plane direction (the X-axis direction and the Y-axis direction) of the respective carbon layers 61, 64, and 67 (about 1500 W/mK, for example) than in the thickness direction (the Z-axis direction) of the respective carbon layers 61, 64, and 67 (about 5 W/mK, for example) can allow heat to be diffused immediately in the in-plane direction of the respective carbon layers 61, 64, and 67.

The respective carbon layers 61, 64, and 67 may be made from carbon fiber or composite material including carbon fiber. Examples of composite material including carbon fiber include carbon fiber reinforced plastics (CFRP) and carbon fiber-reinforced carbon composite material.

The upper insulating layer 65 and the lower insulating layer 62 are each made from insulating material such as ceramic or resin mainly including alumina ($Al_2O_3$), aluminum nitride (AlN), or silicon nitride ($Si_3N_4$), for example. The upper insulating layer 65 and the lower insulating layer 62 may each be a resin substrate made from polyimide resin or a combination of glass fiber and epoxy resin, for example. The upper wiring layers 66*b*, 66*c*, and 66*d* and the lower wiring layers 63*b*, 63*c*, and 63*h* are each conductor foil made from copper (Cu) or aluminum (Al), for example.

Figure 6:
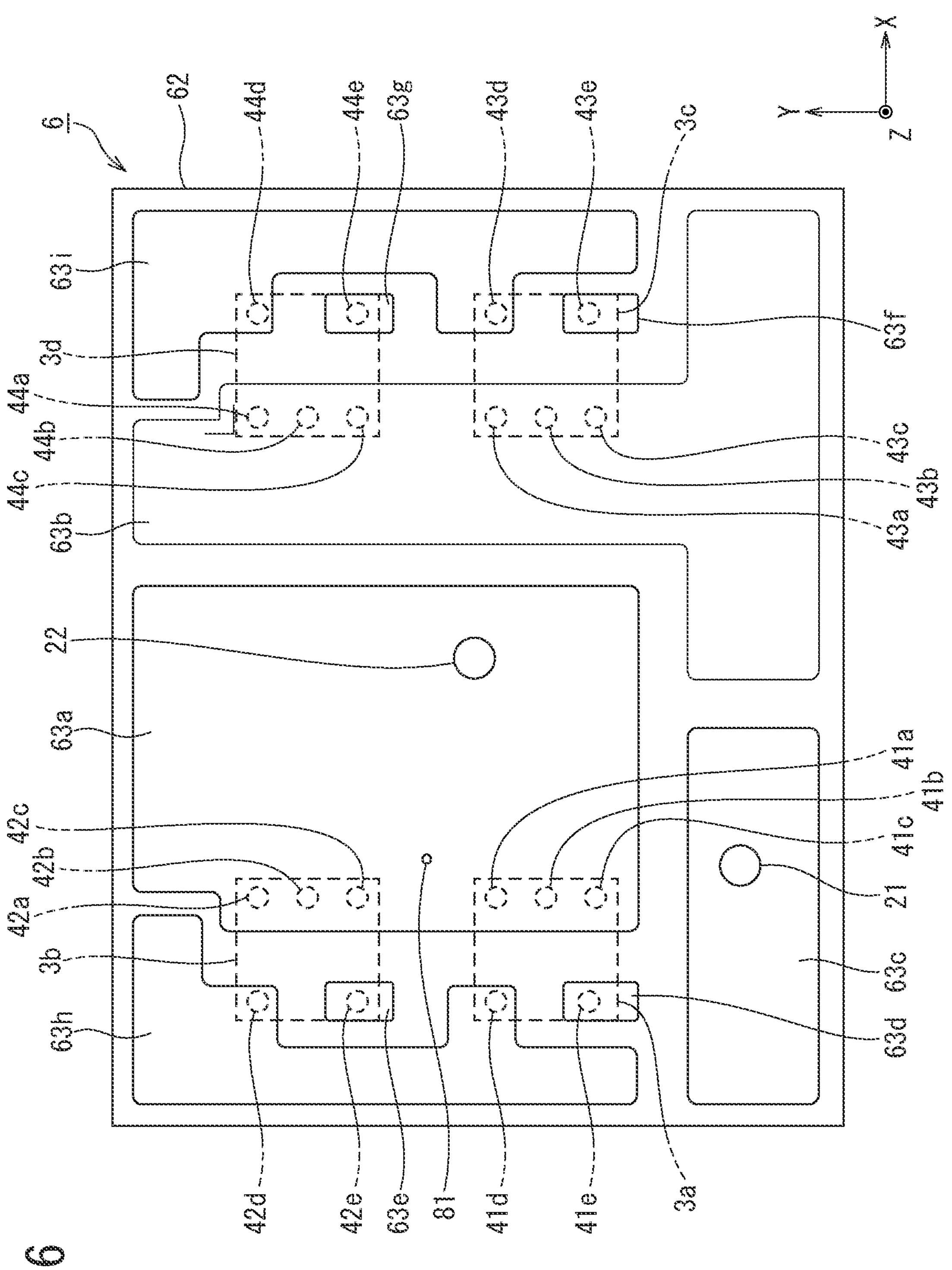
FIG. 6 is a plan view illustrating lower wiring layers in a printed circuit board according to the first embodiment.

FIG. 6 is a view illustrating a planar pattern of the lower insulating layer 62 and the lower wiring layers 63*a* to 63*i* of the printed circuit board 6 as viewed through the lower insulating layer 62 in the negative direction of the Z axis. FIG. 6 schematically illustrates the respective positions at which the semiconductor chips 3*a* to 3*d* overlap with the post electrodes 41*a* to 41*e*, 42*a* to 42*e*, 43*a* to 43*e*, and 44*a* to 44*e*.

The post electrodes 41*a* to 41*c* electrically connect the source electrode of the semiconductor chip 3*a* with the lower wiring layer 63*a* via a part of the conductive layer 46*a* of the interposer 4*a*. The post electrode 41*d* electrically connects the source electrode of the semiconductor chip 3*a* with the lower wiring layer 63*h* via a part of the conductive layer 46*a* of the interposer 4*a*. The post electrode 41*e* electrically connects the gate electrode of the semiconductor chip 3*a* with the lower wiring layer 63*d* via a part of the conductive layer 46*a* of the interposer 4*a*.

The post electrodes 42*a* to 42*c* electrically connect the source electrode of the semiconductor chip 3*b* with the lower wiring layer 63*a* via a part of the conductive layer 46*b* of the interposer 4*b*. The post electrode 42*d* electrically connects the source electrode of the semiconductor chip 3*b* with the lower wiring layer 63*h* via a part of the conductive layer 46*b* of the interposer 4*b*. The post electrode 42*e* electrically connects the gate electrode of the semiconductor chip 3*b* with the lower wiring layer 63*e* via a part of the conductive layer 46*b* of the interposer 4*b*.

The post electrodes 43*a* to 43*c* electrically connect the source electrode of the semiconductor chip 3*c* with the lower wiring layer 63*b* via a part of the conductive layer 46*c* of the interposer 4*c*. The post electrode 43*d* electrically connects the source electrode of the semiconductor chip 3*c* with the lower wiring layer 63*i* via a part of the conductive layer 46*c* of the interposer 4*c*. The post electrode 43*e* electrically connects the gate electrode of the semiconductor chip 3*c* with the lower wiring layer 63*f* via a part of the conductive layer 46*c* of the interposer 4*c*.

The post electrodes 44*a* to 44*c* electrically connect the source electrode of the semiconductor chip 3*d* with the lower wiring layer 63*b* via a part of the conductive layer of the interposer. The post electrode 44*d* electrically connects the source electrode of the semiconductor chip 3*d* with the lower wiring layer 63*i* via a part of the conductive layer of the interposer. The post electrode 44*e* electrically connects the gate electrode of the semiconductor chip 3*d* with the lower wiring layer 63*g* via a part of the conductive layer of the interposer.

Figure 7:
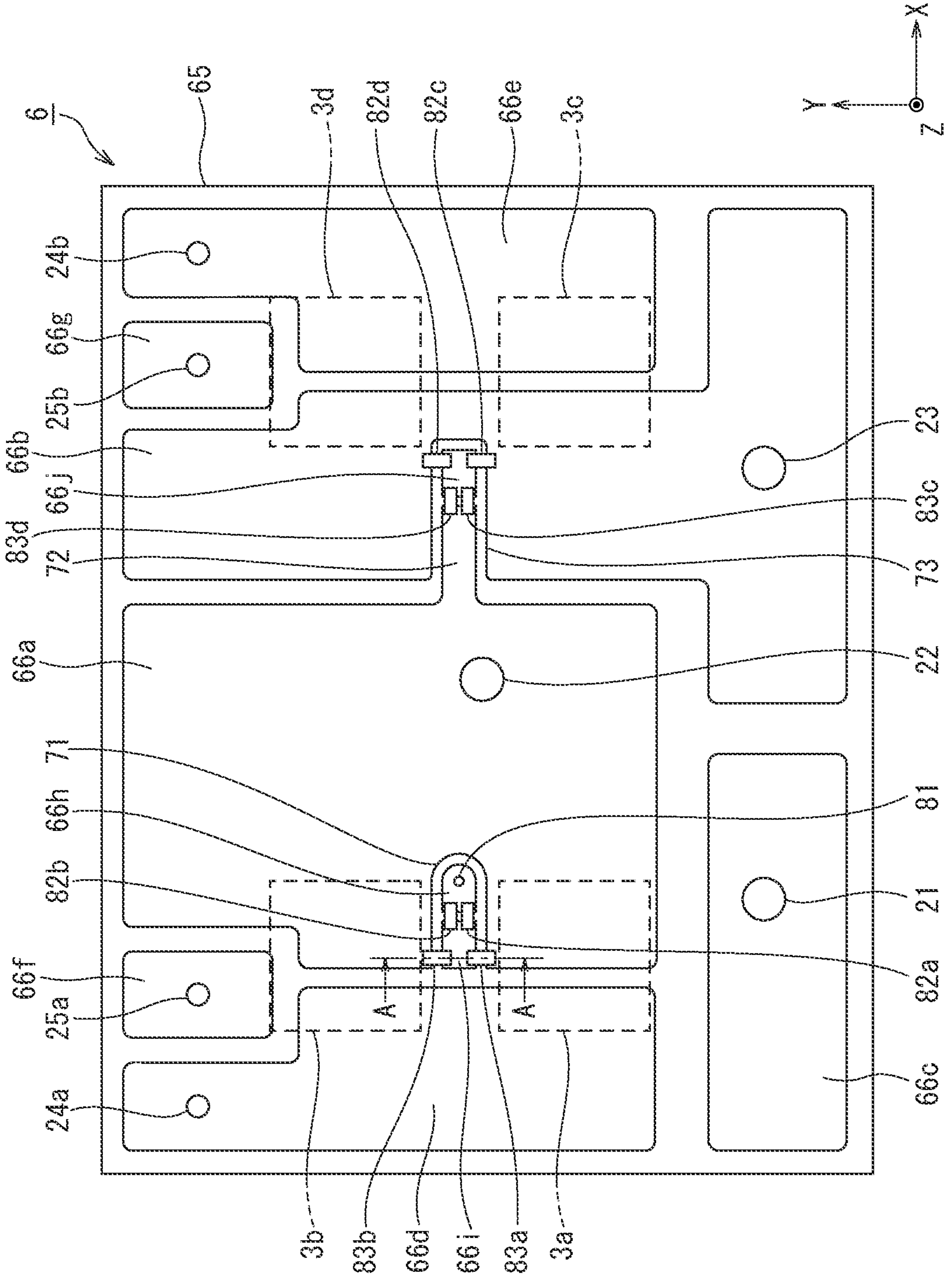
FIG. 7 is a plan view illustrating upper wiring layers in the printed circuit board according to the first embodiment.

FIG. 7 is a view illustrating a planar pattern of the upper insulating layer 65 and the upper wiring layers 66*a* to 66*i* of the printed circuit board 6 as viewed in the negative direction of the Z axis. The upper wiring layer 66*a* is provided to overlap with the lower wiring layer 63*a*. The upper wiring layer 66*a* is electrically connected to the lower wiring layer 63*a* through a via (not illustrated) made from metal such as copper (Cu) and penetrating the carbon layer 61, the lower insulating layer 62, and the upper insulating layer 65.

The upper wiring layer 66*a* is provided with a notched part 71 and a projecting part 72. The notched part 71 is located at a position overlapping with a region interposed between the semiconductor chips 3*a* and 3*b*. The upper wiring layer 66*h* and the upper wiring layer 66*i* are located at the notched part 71. The projecting part 72 is aligned with the notched part 71 in the direction orthogonal to a parallel direction in which the semiconductor chips 3*a* and 3*b* are arranged in parallel (in the X-axis direction).

The upper wiring layer 66*b* is provided to overlap with the lower wiring layer 63*b*. The upper wiring layer 66*b* is electrically connected to the lower wiring layer 63*b* through a via (not illustrated) penetrating the carbon layer 61, the lower insulating layer 62, and the upper insulating layer 65. The upper wiring layer 66*b* is provided with a notched part 73 at a position corresponding to the projecting part 72 of the upper wiring layer 66*a*. The projecting part 72 of the upper wiring layer 66*a* and the upper wiring layer 66*j* are located at the notched part 73.

The upper wiring layer 66*c* is provided to overlap with the lower wiring layer 63*c*. The upper wiring layer 66*c* is electrically connected to the lower wiring layer 63*c* through a via (not illustrated) penetrating the carbon layer 61, the lower insulating layer 62, and the upper insulating layer 65.

The upper wiring layer 66*d* is provided to overlap with the respective lower wiring layers 63*d* and 63*e*. The upper wiring layer 66*d* is electrically connected to the respective lower wiring layers 63*d* and 63*e* through vias (not illustrated) penetrating the carbon layer 61, the lower insulating layer 62, and the upper insulating layer 65.

The upper wiring layer 66*e* is provided to overlap with the respective lower wiring layers 63*f* and 63*g*. The upper wiring layer 66*e* is electrically connected to the respective lower wiring layers 63*f* and 63*g* through vias (not illustrated) penetrating the carbon layer 61, the lower insulating layer 62, and the upper insulating layer 65.

The upper wiring layer 66*f* is provided to overlap with the lower wiring layer 63*h*. The upper wiring layer 66*f* is electrically connected to the lower wiring layer 63*h* through a via (not illustrated) penetrating the carbon layer 61, the lower insulating layer 62, and the upper insulating layer 65.

The upper wiring layer 66*g* is provided to overlap with the lower wiring layer 63*i*. The upper wiring layer 66*g* is electrically connected to the lower wiring layer 63*i* through a via (not illustrated) penetrating the carbon layer 61, the lower insulating layer 62, and the upper insulating layer 65.

As illustrated in FIG. 2 and FIG. 3, the outermost surface of the printed circuit board 6 is coated with a passivation layer (a resist) 9. The passivation layer 9 as used herein can be made from resin material such as hard thermosetting resin having high heat-resistant properties, and specific examples include epoxy resin, maleimide resin, and cyanate resin. Alternatively, the passivation layer 9 to be used may be a coverlay made from polyimide typically used for a flexible printed circuit (FPC), for example. The use of the passivation layer 9 as described herein is optional.

As illustrated in FIG. 2 and FIG. 3, the circumferences of the semiconductor chips 3*a* to 3*d* and the printed circuit board 6 are sealed with a sealing member 10. The sealing member 10 has a substantially cuboidal shape to serve as a casing of the semiconductor device according to the first embodiment. The insulated circuit substrate 1 is exposed on the bottom surface of the sealing member 10. The sealing member 10 as used herein can be made from resin material such as hard thermosetting resin having high heat-resistant properties, and specific examples include epoxy resin, maleimide resin, and cyanate resin.

As illustrated in FIG. 2 and FIG. 3, the semiconductor device according to the first embodiment includes external connection terminals 21 to 23 connected to an external circuit. The external connection terminals 21 to 23 may have a stick-like (a pin-like) or columnar shape, and in particular, may be a round column, a cylindroid, or a polygonal column such as a triangular column or a quadrangular column, for example. The material used for the external connection terminals 21 to 23 can be conductive material such as copper (Cu), for example.

The external connection terminal 21 serves as the positive-electrode terminal P illustrated in FIG. 1. As illustrated in FIG. 4, the lower end of the external connection terminal 21 is bonded to the top surface of the upper conductor layer 12*a* of the insulated circuit substrate 1 via a bonding member (not illustrated) such as solder or sintered material. The external connection terminal 21 penetrates the lower wiring layer 63*c* and the upper wiring layer 66*c* of the printed circuit board 6, as illustrated I FIG. 6 and FIG. 7. A current supplied from the external connection terminal 21 is further supplied to the respective drain electrodes of the semiconductor chips 3*a* and 3*b* via the upper conductor layer 12*a*.

The external connection terminal 22 serves as the output terminal U illustrated in FIG. 1. As illustrated in FIG. 4, the lower end of the external connection terminal 22 is bonded to the top surface of the upper conductor layer 12*b* of the insulated circuit substrate 1 via a bonding member (not illustrated) such as solder or sintered material. The external connection terminal 22 penetrates the printed circuit board 6 and is electrically connected to the lower wiring layer 63*a* and the upper wiring layer 66*a* of the printed circuit board 6, as illustrated in FIG. 6 and FIG. 7. The external connection terminal 22 outputs an output current between the respective source electrodes of the semiconductor chips 3*a* and 3*b* and the respective drain electrodes of the semiconductor chips 3*c* and 3*d* to the external circuit via the lower wiring layer 63*a* and the upper wiring layer 66*a*.

The external connection terminal 23 serves as the negative-electrode terminal N illustrated in FIG. 1. As illustrated in FIG. 7, the lower end of the external connection terminal 23 is bonded to the top surface of the upper wiring layer 66*b* of the printed circuit board 6 via a bonding member (not illustrated) such as solder or sintered material. The external connection terminal 23 outputs a current of the source electrodes of the semiconductor chips 3*c* and 3*d* to the external circuit via the lower wiring layer 63*b* and the upper wiring layer 66*b*.

As illustrated in FIG. 7, the semiconductor device according to the first embodiment includes external connection terminals 24*a*, 24*b*, 25*a*, and 25*b* connected to the external circuit. FIG. 2 and FIG. 3 omit the illustration of the external connection terminals 24*a*, 24*b*, 25*a*, and 25*b*. The respective external connection terminals 24*a*, 24*b*, 25*a*, and 25*b* may have a stick-like (a pin-like) or columnar shape, and in particular, may be a round column, a cylindroid, or a polygonal column such as a triangular column or a quadrangular column, for example. The respective external connection terminals 24*a*, 24*b*, 25*a*, and 25*b* can be made from conductive material such as copper (Cu), for example.

The external connection terminal 24*a* serves as the gate terminal G1 illustrated in FIG. 1. The lower end of the external connection terminal 24*a* is bonded to the top surface of the upper wiring layer 66*d* of the printed circuit board 6 via a bonding member (not illustrated) such as solder or sintered material. The external connection terminal 24*a* supplies control signals for controlling the ON-OFF operations of the semiconductor chips 3*a* and 3*b* to the respective gate electrodes of the semiconductor chips 3*a* and 3*b* via the upper wiring layer 66*d* and the lower wiring layers 63*d* and 63*e*.

The external connection terminal 24*b* serves as the gate terminal G2 illustrated in FIG. 1. The lower end of the external connection terminal 24*b* is bonded to the top surface of the upper wiring layer 66*e* of the printed circuit board 6 via a bonding member (not illustrated) such as solder or sintered material. The external connection terminal 24*b* supplies control signals for controlling the ON-OFF operations of the semiconductor chips 3*c* and 3*d* to the respective gate electrodes of the semiconductor chips 3*c* and 3*d* via the upper wiring layer 66*e* and the lower wiring layers 63*f* and 63*g*.

The external connection terminal 25*a* serves as the auxiliary source terminal S1 illustrated in FIG. 1. The lower end of the external connection terminal 25*a* is bonded to the top surface of the upper wiring layer 66*f* of the printed circuit board 6 via a bonding member (not illustrated) such as solder or sintered material. The external connection terminal 25*a* outputs signals (source-side voltages) of the semiconductor chips 3*a* and 3*b* to the external circuit via the upper wiring layer 66*f* and the lower wiring layer 63*h*.

The external connection terminal 25*b* serves as the auxiliary source terminal S2 illustrated in FIG. 1. The lower end of the external connection terminal 25*b* is bonded to the top surface of the upper wiring layer 66*g* of the printed circuit board 6 via a bonding member (not illustrated) such as solder or sintered material. The external connection terminal 25*b* outputs signals (source-side voltages) of the semiconductor chips 3*c* and 3*d* to the external circuit via the upper wiring layer 66*g* and the lower wiring layer 63*i*.

As illustrated in FIG. 2 to FIG. 4, the lower end of the relay terminal 81 is bonded to the top surface of the upper conductor layer 12*a* of the insulated circuit substrate 1 via a bonding member (not illustrated) such as solder or sintered material. The relay terminal 81 penetrates the printed circuit board 6 and is electrically connected to the lower wiring layer 63*a* and the upper wiring layer 66*h* of the printed circuit board 6, as illustrated in FIG. 6 and FIG. 7. The relay terminal 81 may have a stick-like (a pin-like) or columnar shape, and in particular, may be a round column, a cylindroid, or a polygonal column such as a triangular column or a quadrangular column, for example. The material used for the relay terminal 81 can be conductive material such as copper (Cu), for example.

As illustrated in FIG. 2, FIG. 3, and FIG. 7, the semiconductor device according to the first embodiment includes a snubber circuit (82*a*, 82*b*, 83*a*, and 83*b*) on the upper-arm side and a snubber circuit (82*c*, 82*d*, 83*c*, and 83*d*) on the lower-arm side both arranged on the top surface side of the printed circuit board 6. The snubber circuit (82*a*, 82*b*, 83*a*, and 83*b*) corresponds to the snubber circuit 101 illustrated in FIG. 1, and the snubber circuit (82*c*, 82*d*, 83*c*, and 83*d*) corresponds to the snubber circuit 102 illustrated in FIG. 1.

The snubber circuit (82*a*, 82*b*, 83*a*, and 83*b*) on the upper-arm side includes capacitive elements (snubber capacitors) 82*a* and 82*b* and resistive elements (snubber resistors) 83*a* and 83*b* arranged on the top surface side of the printed circuit board 6. The capacitive elements 82*a* and 82*b* correspond to serve as the capacitor C1 illustrated in FIG. 1, and the resistive elements 83*a* and 83*b* correspond to serve as the resistor R1 illustrated in FIG. 1.

The capacitive elements 82*a* and 82*b* are each a surface packaged-type (horizontal-type) layered ceramic capacitor, and may be a high heat-resistant capacitor available from NOVACAP, for example. The resistive elements 83*a* and 83*b* are each a surface packaged-type (horizontal-type) resistor, and may be a wide electrode-type resistor typically used for high-power products, for example.

The capacitive elements 82*a* and 82*b* are located on the printed circuit board 6 at positions overlapping with a region interposed between the semiconductor chips 3*a* and 3*b*. The capacitive element 82*a* and 82*b* are separated from each other in the parallel direction in which the semiconductor chips 3*a* and 3*b* are arranged in parallel (in the Y-axis direction), and are provided to extend parallel to each other in the direction orthogonal to the parallel-arranged direction of the semiconductor chips 3*a* and 3*b* (in the X-axis direction). Each one end of the capacitive elements 82*a* and 82*b* is located on the upper wiring layer 66*h* so as to be electrically connected to the relay terminal 81 via the upper wiring layer 66*h*. Each of the other ends of the capacitive elements 82*a* and 82*b* is located on the upper wiring layer 66*i*.

While the present embodiment is illustrated with the case in which the two capacitive elements 82*a* and 82*b* are provided, the semiconductor device may include a single capacitive element, or may include three or more capacitive elements so as to be arranged parallel to each other.

The resistive elements 83*a* and 83*b* are located on the printed circuit board 6 at positions overlapping with the region interposed between the semiconductor chips 3*a* and 3*b*. The resistive elements 83*a* and 83*b* are aligned and separated from each other in the parallel-arranged direction of the semiconductor chips 3*a* and 3*b* (in the Y-axis direction), and are provided to extend in the parallel-arranged direction of the semiconductor chips 3*a* and 3*b*. Each one end of the resistive elements 83*a* and 83*b* is located on the upper wiring layer 66*i* so as to be electrically connected to the other ends of the capacitive elements 82*a* and 82*b* via the upper wiring layer 66*i*. Each of the other ends of the resistive elements 83*a* and 83*b* is located on the upper wiring layer 66*a* so as to be electrically connected to the external connection terminal 22 via the upper wiring layer 66*a*.

Figure 8:
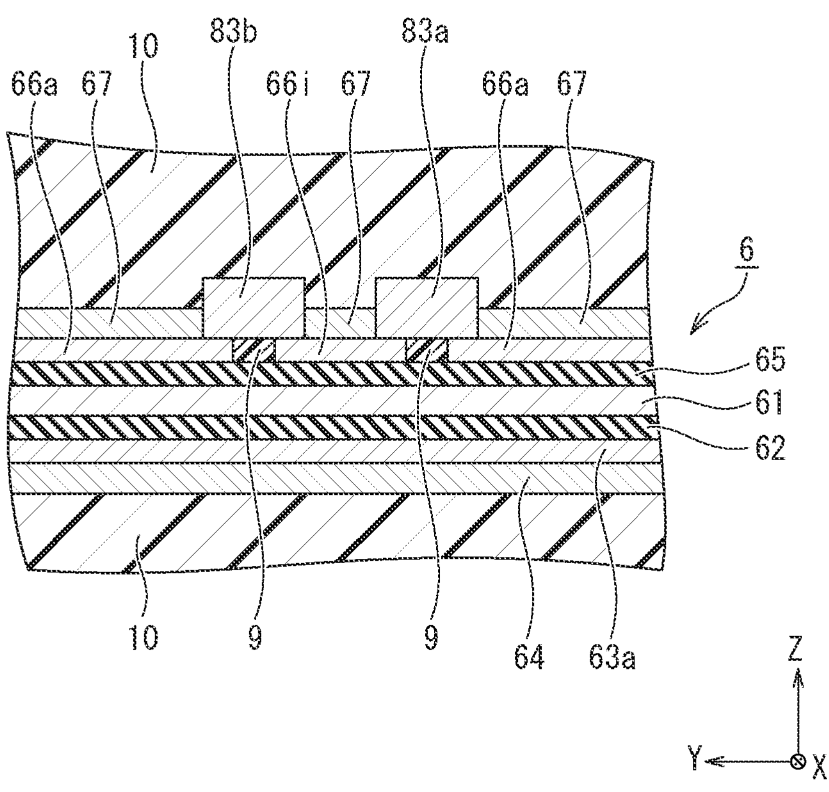
FIG. 8 is a cross-sectional view illustrating the printed circuit board and resistive elements as viewed from direction A-A in FIG. 7.

FIG. 8 is a cross-sectional view illustrating the resistive elements 83*a* and 83*b* taken along line A-A in FIG. 7. As illustrated in FIG. 8, each one end of the resistive elements 83*a* and 83*b* is bonded onto the upper wiring layer 66*i* via a bonding member (not illustrated) such as solder or sintered material. Each of the other ends of the resistive elements 83*a* and 83*b* is bonded onto the upper wiring layer 66*a* via a bonding member (not illustrated) such as solder or sintered material.

While the present embodiment is illustrated with the case in which the two resistive elements 83*a* and 83*b* are provided, the semiconductor device may include a single resistive element, or may include three or more resistive elements so as to be arranged parallel to each other.

As illustrated in FIG. 7, the snubber circuit (82*c*, 82*d*, 83*c*, and 83*d*) on the lower-arm side includes capacitive elements (snubber capacitors) 82*c* and 82*d* and resistive elements (snubber resistors) 83*c* and 83*d* each arranged on the top surface side of the printed circuit board 6. The capacitive elements 82*c* and 82*d* correspond to serve as the capacitor C2 illustrated in FIG. 1, and the resistive elements 83*c* and 83*d* correspond to serve as the resistor R2 illustrated in FIG. 1. The capacitive elements 82*c* and 82*d* have the same configuration as the capacitive elements 82*a* and 82*b* described above. The resistive elements 83*c* and 83*d* have the same configuration as the resistive elements 83*a* and 83*b* described above.

The capacitive elements 82*c* and 82*d* are located on the printed circuit board 6 at positions overlapping with a region distant from the respective semiconductor chips 3*c* and 3*d* with the same distance. The capacitive elements 82*c* and 82*d* are aligned and separated from each other in the parallel-arranged direction of the semiconductor chips 3*c* and 3*d* (in the Y-axis direction), and are provided to extend in the parallel-arranged direction of the semiconductor chips 3*c* and 3*d* (in the Y-axis direction). Each one end of the capacitive elements 82*c* and 82*d* is located on the upper wiring layer 66*j*. Each of the other ends of the capacitive elements 82*c* and 82*d* is located on the upper wiring layer 66*b* so as to be electrically connected to the external connection terminal 23 via the upper wiring layer 66*b*.

While the present embodiment is illustrated with the case in which the two capacitive elements 82*c* and 82*d* are provided, the semiconductor device may include a single capacitive element, or may include three or more capacitive elements so as to be arranged parallel to each other.

The resistive elements 83*c* and 83*d* are located on the printed circuit board 6 at positions overlapping with the region distant from the respective semiconductor chips 3*c* and 3*d* with the same distance. The resistive elements 83*c* and 83*d* are separated from each other in the parallel-arranged direction of the semiconductor chips 3*c* and 3*d* (in the Y-axis direction), and are provided to extend parallel to each other in the direction orthogonal to the parallel-arranged direction of the semiconductor chips 3*c* and 3*d* (in the X-axis direction). Each one end of the resistive elements 83*c* and 83*d* is located on the upper wiring layer 66*j* so as to be electrically connected to each of the other ends of the capacitive elements 82*c* and 82*d* via the upper wiring layer 66*j*. Each of the other ends of the resistive elements 83*c* and 83*d* is located on the projecting part 72 of the upper wiring layer 66*a* so as to be electrically connected to the external connection terminal 22 via the upper wiring layer 66*a*.

While the present embodiment is illustrated with the case in which the two resistive elements 83*c* and 83*d* are provided, the semiconductor device may include a single resistive element, or may include three or more resistive elements so as to be arranged parallel to each other.

The number of the resistive elements and the capacitive elements mounted on the printed circuit board 6 in the semiconductor device according to the first embodiment can be changed as appropriate depending on the current rating and the structure of the module, or the characteristics of the device and the characteristics of the resistive elements and the capacitive elements. The layout in the semiconductor device according to the first embodiment can also be changed as appropriate depending on the number of the resistive elements and the capacitive elements to be mounted.

An example of a method of manufacturing (assembling) the semiconductor device according to the first embodiment is as follows: the insulated circuit substrate 1 as illustrated in FIG. 1 is prepared first, and the semiconductor chips 3*a* to 3*d* are then mounted on the upper conductor layers 12*a* and 12*b* of the insulated circuit substrate 1 via the bonding members 2*a* to 2*c* and the like. Next, the interposers 4*a* to 4*c* and the like are mounted on the semiconductor chips 3*a* to 3*d* via the bonding members (not illustrated).

Next, the printed circuit board 6 equipped with the relay terminal 81, the external connection terminals 21 to 23, 24*a*, 24*b*, 25*a*, and 25*b*, and the snubber circuits (82*a*, 82*b*, 83*a*, and 83*b*) and (82*c*, 82*d*, 83*c*, and 83*d*) is prepared, and the printed circuit board 6 is further mounted on the interposers 4*a* to 4*c* and the like via the bonding member 5.

Next, the insulated circuit substrate 1, the semiconductor chips 3*a* to 3*d*, the interposers 4*a* to 4*c* and the like, and the printed circuit board 6 are collectively bonded together via the bonding members 2*a* to 2*c* and 5 and the like by heat treatment. Thereafter, the circumference of the insulated circuit substrate 1, the semiconductor chips 3*a* to 3*d*, the interposers 4*a* to 4*c* and the like, and the printed circuit board 6 is sealed with the sealing member 10. The semiconductor device according to the first embodiment is thus completed.

The semiconductor device according to the first embodiment, in which the snubber circuits 101 and 102 are connected to the MOS transistor T1 implementing the upper arm and the MOS transistor T2 implementing the lower arm, can decrease a surge voltage when turned off, and can also decrease a turn-off loss in association with a decrease in ringing.

Further, the configuration in which the snubber circuits (82*a*, 82*b*, 83*a*, and 83*b*) and (82*c*, 82*d*, 83*c*, and 83*d*) are mounted on the printed circuit board 6 can decrease an influence of a thermal stress, as compared with a case in which the snubber circuits are mounted on the insulated circuit substrate 1, so as to improve the reliability of the snubber circuits (82*a*, 82*b*, 83*a*, and 83*b*) and (82*c*, 82*d*, 83*c*, and 83*d*).

The configuration in which the snubber circuits (82*a*, 82*b*, 83*a*, and 83*b*) and (82*c*, 82*d*, 83*c*, and 83*d*) are mounted on the printed circuit board 6 can also avoid or decrease the transmission of heat generated in the semiconductor chips 3*a* to 3*d* to the snubber circuits (82*a*, 82*b*, 83*a*, and 83*b*) and (82*c*, 82*d*, 83*c*, and 83*d*), as compared with the case in which the snubber circuits are mounted on the insulated circuit substrate 1, so as to avoid a variation in capacity of the capacitive elements 82*a* to 82*d* caused by the heat generation in the semiconductor chips 3*a* to 3*d* to suppress an increase in switching loss accordingly.

Further, the provision of the carbon layers 61, 64, and 67 in the printed circuit board 6 can block the heat transmitted from the semiconductor chips 3*a* to 3*d*, and can also immediately diffuse heat generated in the printed circuit board 6. This can further avoid or decrease the transmission of the heat generated in the semiconductor chips 3*a* to 3*d* to the snubber circuits (82*a*, 82*b*, 83*a*, and 83*b*) and (82*c*, 82*d*, 83*c*, and 83*d*) on the printed circuit board 6. The suppression of the heat transmission can also avoid a variation in the capacity of the capacitive elements 82*a* to 82*d* derived from the heat generation in the semiconductor chips 3*a* to 3*d* to further suppress an increase in switching loss accordingly.

The configuration in which the snubber circuits (82*a*, 82*b*, 83*a*, and 83*b*) and (82*c*, 82*d*, 83*c*, and 83*d*) are mounted on the printed circuit board 6 can further decrease a parasitic inductance in the wires between the snubber circuits (82*a*, 82*b*, 83*a*, and 83*b*) and (82*c*, 82*d*, 83*c*, and 83*d*) and the semiconductor chips 3*a* to 3*d*, since the snubber circuits (82*a*, 82*b*, 83*a*, and 83*b*) and (82*c*, 82*d*, 83*c*, and 83*d*) are located closer to the semiconductor chips 3*a* to 3*d* than a case in which the snubber circuits are arranged adjacent to the terminals of the semiconductor device. This can efficiently damp down surge voltage or noise, and can reduce a switching loss accordingly.

Figure 9:
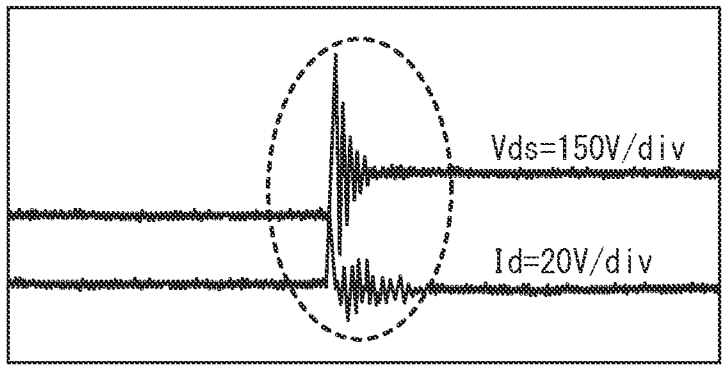
FIG. 9 is a view showing voltage and current waveforms of a semiconductor device of a comparative example when turned off.
Figure 10:
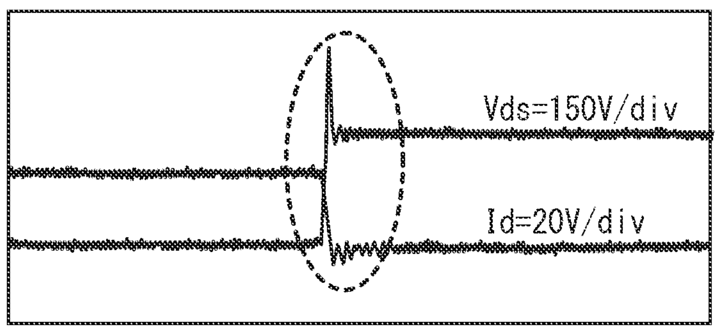
FIG. 10 is a view showing voltage and current waveforms of the semiconductor device according to the first embodiment when turned off.

FIG. 9 is a view showing voltage and current waveforms of a semiconductor device of a comparative example when turned off, and FIG. 10 is a view showing voltage and current waveforms of the semiconductor device according to the first embodiment when turned off. The semiconductor device of the comparative example differs from the semiconductor device according to the first embodiment in not including any snubber circuits. As illustrated in FIG. 9, the semiconductor device of the comparative example is greatly affected by ringing, and thus could cause a malfunction afterward. In contrast, the semiconductor device according to the first embodiment with the configuration as described above can decrease the ringing and the first undershoot, as shown in FIG. 10.

Second Embodiment

Figure 11:
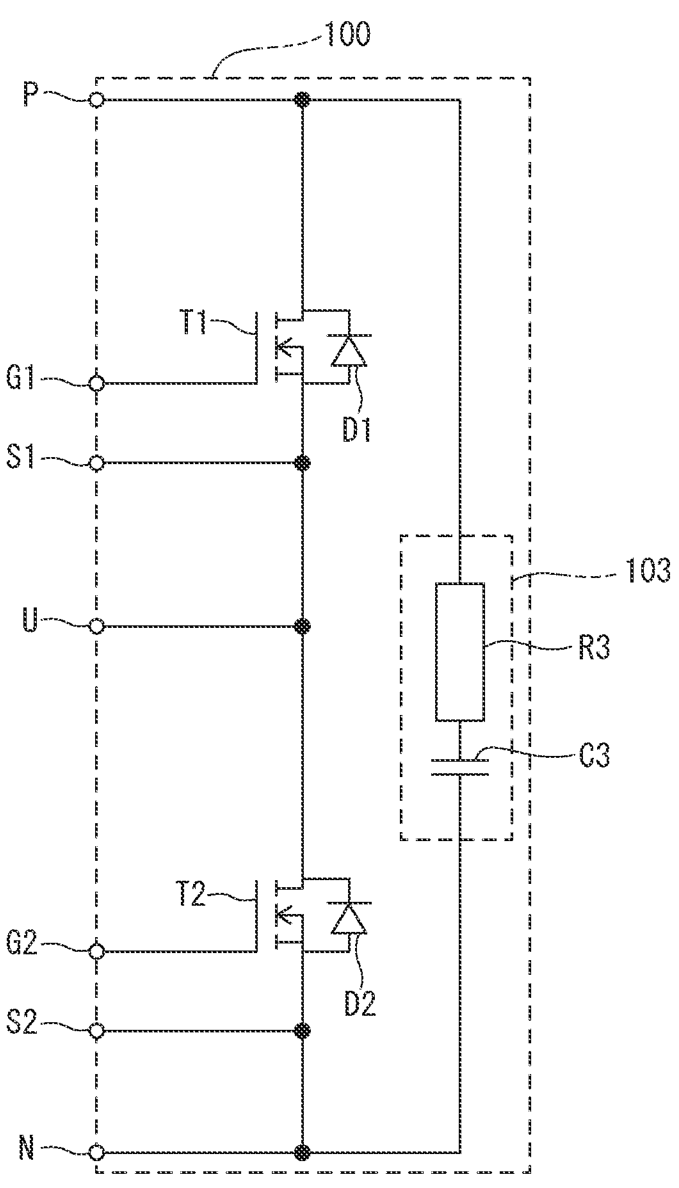
FIG. 11 is an equivalent circuit diagram of a semiconductor device according to a second embodiment.

A semiconductor device according to a second embodiment has a circuit configuration that differs from that of the semiconductor device according to the first embodiment in that a snubber circuit 103 is connected between the positive-electrode terminal P and the negative-electrode terminal N, as illustrated in FIG. 11. The snubber circuit 103 includes a resistor R3 and a capacitor C3. One end of the resistor R3 is connected to the positive-electrode terminal P. The other end of the resistor R3 is connected to one end of the capacitor C3. The other end of the capacitor C3 is connected to the negative-electrode terminal N. The other elements of the circuit configuration of the semiconductor device according to the second embodiment are the same as those of the semiconductor device according to the first embodiment, and overlapping explanations are not repeated below.

Figure 12:
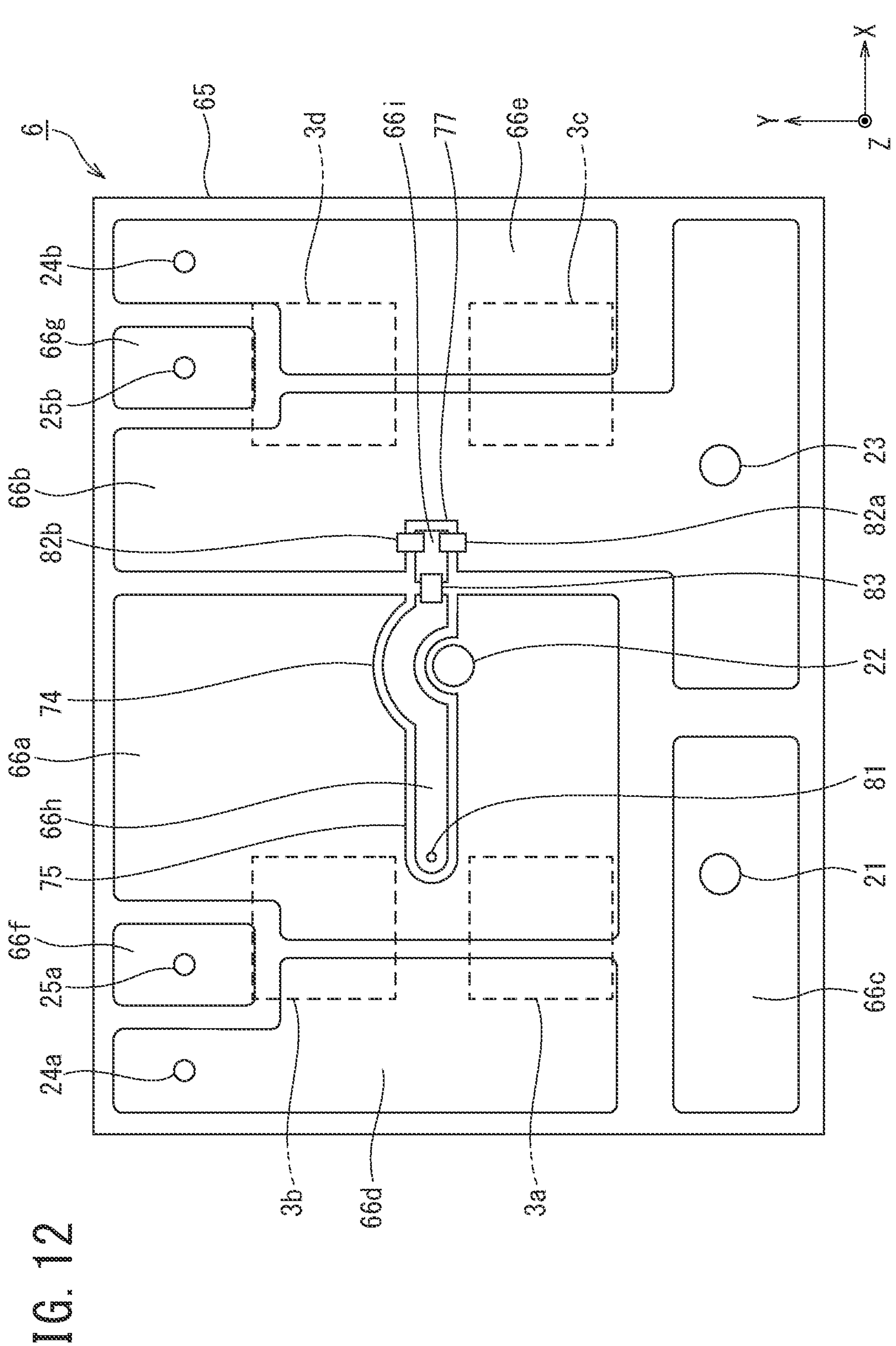
FIG. 12 is a plan view illustrating upper wiring layers of a printed circuit board according to the second embodiment.

FIG. 12 is a view illustrating the planar pattern including the upper insulating layer 65 and the upper wiring layers 66*a* to 66*i* of the printed circuit board 6 in the semiconductor device according to the second embodiment as viewed in the negative direction of the Z axis. As illustrated in FIG. 12, the planar pattern regarding the upper wiring layers 66*c* to 66*g* of the upper wiring layers 66*a* to 66*i* is common to that of the semiconductor device according to the first embodiment illustrated in FIG. 7, but the planar pattern regarding the other upper wiring layers 66*a*, 66*b*, 66*h*, and 66*i* is different from that of the semiconductor device according to the first embodiment illustrated in FIG. 7.

The upper wiring layer 66*a* is provided with a notched part 74 having a curved shape along the external connection terminal 22, and is further provided with a notched part 75 having a straight shape integrated with the notched part 74. The upper wiring layer 66*h* is located in the notched parts 74 and 75. The part of the upper wiring layer 66*b* opposed to the notched part 74 is provided with a notched part 77. The upper wiring layer 66*i* is located in the notched part 77.

As illustrated in FIG. 12, the semiconductor device according to the second embodiment includes the snubber circuit (82*a*, 82*b*, and 83) implemented by the capacitive elements 82*a* and 82*b* and the resistive element 83 arranged on the printed circuit board 6. The snubber circuit (82*a*, 82*b*, and 83) illustrated in FIG. 12 corresponds to the snubber circuit 103 illustrated in FIG. 11, the capacitive elements 82*a* and 82*b* illustrated in FIG. 12 correspond to the capacitor C3 illustrated in FIG. 11, and the resistive element 83 illustrated in FIG. 12 corresponds to the resistor R3 illustrated in FIG. 11.

The capacitive elements 82*a* and 82*b* are located on the printed circuit board 6 at positions overlapping with a region distant from the respective semiconductor chips 3*c* and 3*d* with the same distance. The capacitive elements 82*a* and 82*b* are aligned and separated from each other in the parallel-arranged direction of the semiconductor chips 3*c* and 3*d* (in the Y-axis direction). Each one end of the capacitive elements 82*a* and 82*b* is located on the upper wiring layer 66*i*. Each of the other ends of the capacitive elements 82*a* and 82*b* is located on the upper wiring layer 66*b* so as to be electrically connected to the external connection terminal 23 via the upper wiring layer 66*b*.

While the present embodiment is illustrated with the case in which the two capacitive elements 82*a* and 82*b* are provided, the semiconductor device may include a single capacitive element, or may include three or more capacitive elements so as to be arranged parallel to each other.

The number of the resistive elements and the capacitive elements mounted on the printed circuit board 6 in the semiconductor device according to the second embodiment can be changed as appropriate depending on the current rating and the structure of the module, or the characteristics of the device and the characteristics of the resistive elements and the capacitive elements. The layout in the semiconductor device according to the second embodiment can also be changed as appropriate depending on the number of the resistive elements and the capacitive elements to be mounted.

The resistive element 83 is located on the printed circuit board 6 at a position overlapping with the region distant from the respective semiconductor chips 3*c* and 3*d* with the same distance, and is located at the position distant from the respective capacitive elements 82*a* and 82*b* with the same distance. The resistive element 83 is arranged so as to extend in the direction orthogonal to the parallel-arranged direction of the semiconductor chips 3*c* and 3*d* (in the X-axis direction). One end of the resistive element 83 is located on the upper wiring layer 66*i* so as to be electrically connected to each of the other ends of the capacitive elements 82*a* and 82*b* via the upper wiring layer 66*i*. The other end of the resistive element 83 is located on the upper wiring layer 66*h* so as to be electrically connected to the relay terminal 81 via the upper wiring layer 66*h*.

While the present embodiment is illustrated with the case in which the single resistive element 83 is provided, the semiconductor device may include two or more resistive elements so as to be arranged parallel to each other.

The lower end of the relay terminal 81 is bonded to the top surface of the upper conductor layer 12*a* of the insulated circuit substrate 1 via a bonding member (not illustrated)

such as solder or sintered material. The other configurations of the semiconductor device according to the second embodiment are the same as those of the semiconductor device according to the first embodiment, and overlapping explanations are not repeated below.

The semiconductor device according to the second embodiment, in which the snubber circuit 103 is connected between the positive-electrode terminal P and the negative-electrode terminal N, can also decrease a surge voltage when turned off, and can further decrease a turn-off loss in association with a decrease in ringing.

Further, the configuration in which the snubber circuit (82*a*, 82*b*, and 83) is mounted on the printed circuit board 6 can decrease an influence of a thermal stress, as compared with a case in which the snubber circuit is mounted on the insulated circuit substrate 1, so as to improve the reliability of the snubber circuit (82*a*, 82*b*, and 83).

The configuration in which the snubber circuit (82*a*, 82*b*, and 83) is mounted on the printed circuit board 6 can also avoid or decrease the transmission of heat generated in the semiconductor chips 3*a* to 3*d* to the snubber circuit (82*a*, 82*b*, and 83), as compared with the case in which the snubber circuit is mounted on the insulated circuit substrate 1, so as to avoid a variation in the capacity of the capacitive elements 82*a* and 82*b* caused by the heat generation in the semiconductor chips 3*a* to 3*d* to suppress an increase in switching loss accordingly.

Further, the provision of the carbon layers 61, 64, and 67 in the printed circuit board 6 can block the heat transmitted from the semiconductor chips 3*a* to 3*d*, and can also immediately diffuse heat generated in the printed circuit board 6. This can further avoid or decrease the transmission of the heat generated in the semiconductor chips 3*a* to 3*d* to the snubber circuit (82*a*, 82*b*, and 83) on the printed circuit board 6. The suppression of the heat transmission can also avoid a variation in the capacity of the capacitive elements 82*a* and 82*b* caused by the heat generation in the semiconductor chips 3*a* to 3*d* to further suppress the increase in the switching loss accordingly.

The configuration in which the snubber circuit (82*a*, 82*b*, and 83) is mounted on the printed circuit board 6 can also decrease a parasitic inductance in the wires between the snubber circuit (82*a*, 82*b*, and 83) and the semiconductor chips 3*a* to 3*d*, since the snubber circuit (82*a*, 82*b*, and 83) is located closer to the semiconductor chips 3*a* to 3*d* than a case in which the snubber circuit is arranged adjacent to the terminals of the semiconductor device. This can efficiently damp down a surge voltage or noise, and can reduce a switching loss accordingly.

Third Embodiment

Figure 13:
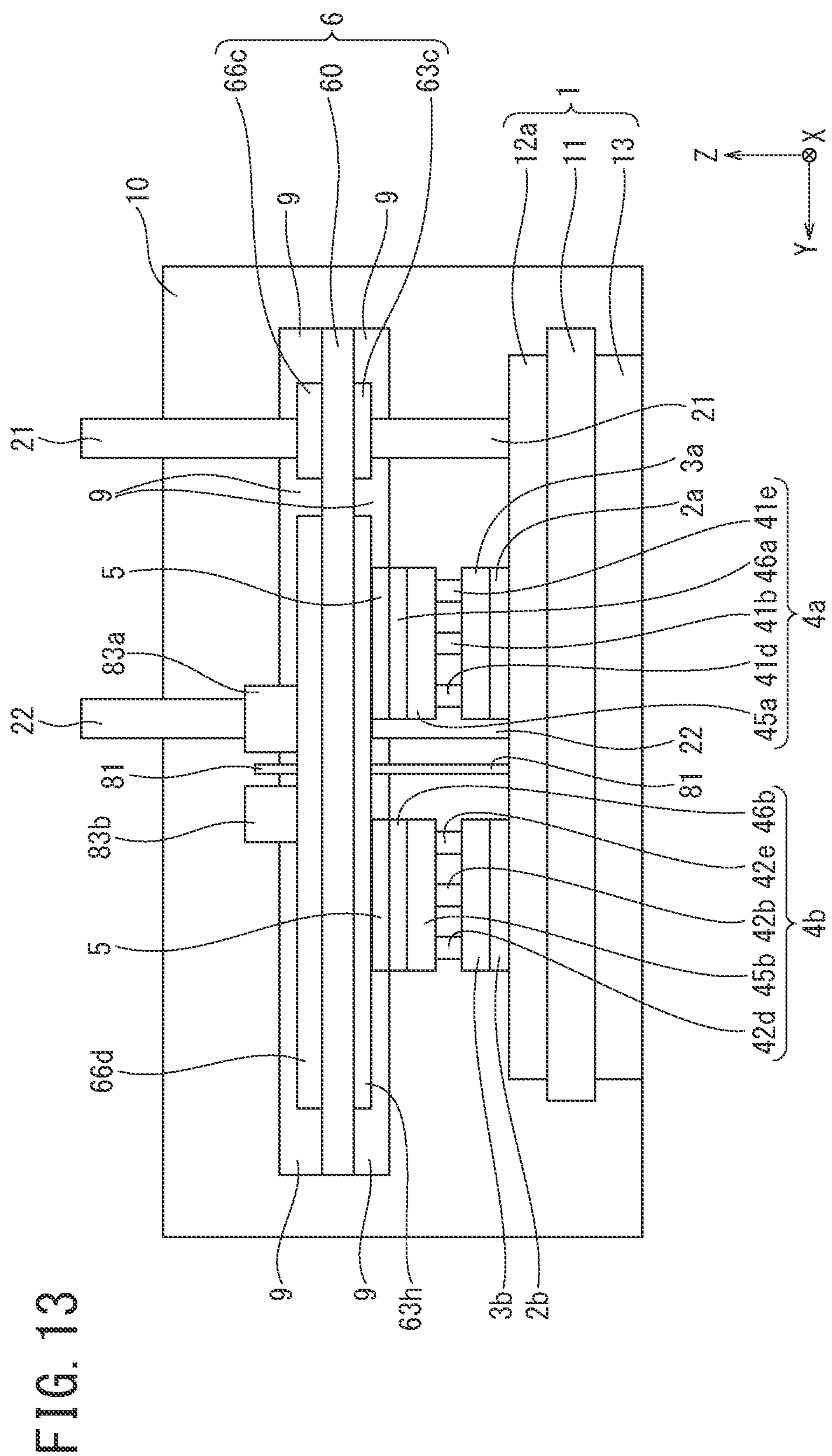
FIG. 13 is a side view illustrating a semiconductor device according to a third embodiment.

A semiconductor device according to a third embodiment differs from the semiconductor device according to the first embodiment in that the printed circuit board 6 does not include any carbon layers, as illustrated in FIG. 13. The printed circuit board 6 includes an insulating layer 60, upper wiring layers 66*c*, 66*d*, and the like deposited on the top surface of the insulating layer 60, and lower wiring layers 63*c*, 63*h*, and the like deposited on the bottom surface of the insulating layer 60. The other configurations of the semiconductor device according to the third embodiment are the same as those of the semiconductor device according to the first embodiment, and overlapping explanations are not repeated below.

The semiconductor device according to the third embodiment with the configuration not including any carbon layers in the printed circuit board 6 can also achieve the effects similar to those of the semiconductor device according to the first embodiment.

Fourth Embodiment

Figure 14:
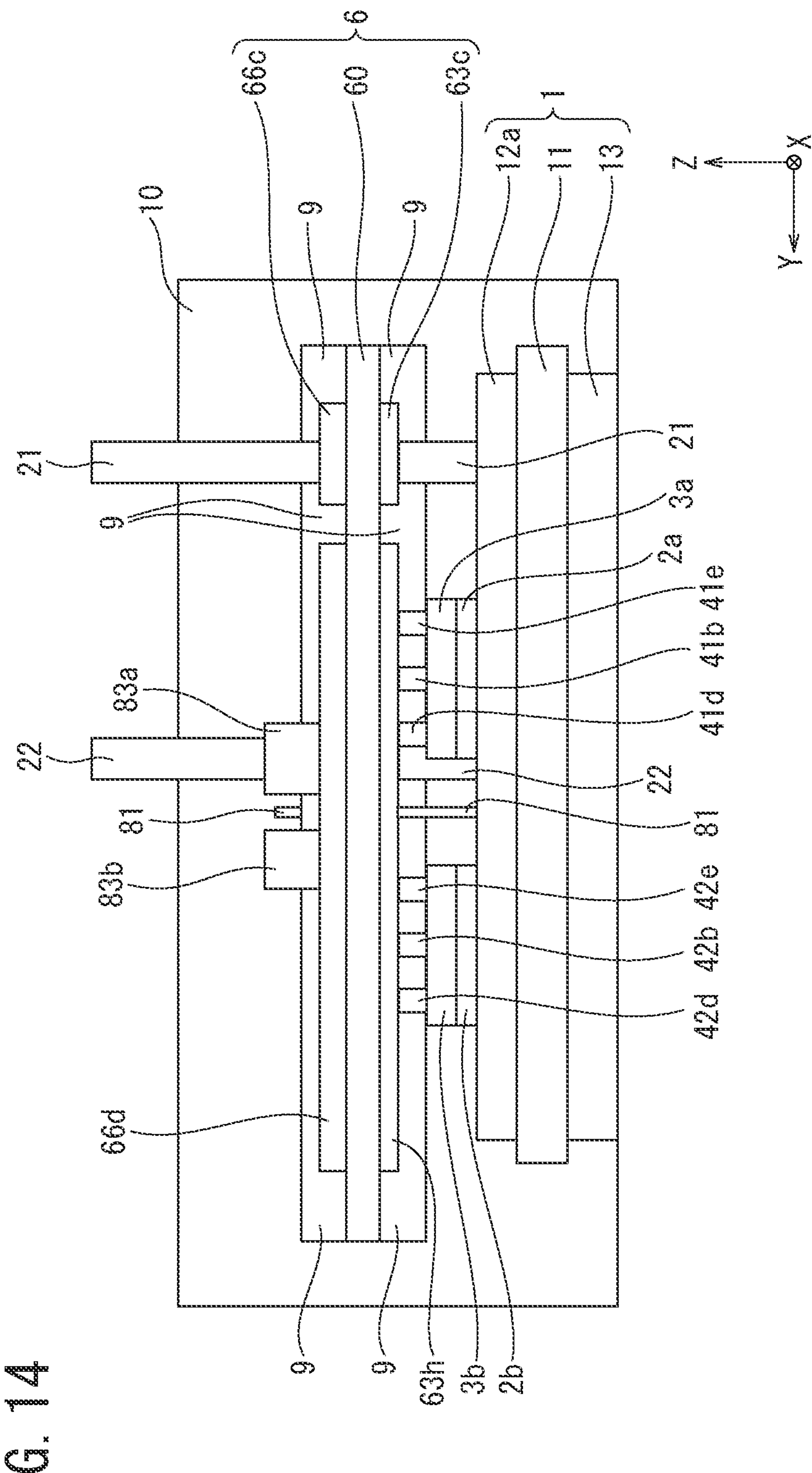
FIG. 14 is a side view illustrating a semiconductor device according to a fourth embodiment.

A semiconductor device according to a fourth embodiment differs from the semiconductor device according to the third embodiment in not including any interposers between the semiconductor chips 3*a* and 3*b* and the printed circuit board 6, as illustrated in FIG. 14. The top surface of the semiconductor chip 3*a* is bonded to the lower wiring layer 63*h* and the like of the printed circuit board 6 via the post electrodes 41*b*, 41*d*, 41*e*, and the like. The top surface of the semiconductor chip 3*b* is bonded to the lower wiring layer 63*h* and the like of the printed circuit board 6 via the post electrodes 42*b*, 42*d*, 42*e*, and the like. The other configurations of the semiconductor device according to the fourth embodiment are the same as those of the semiconductor device according to the third embodiment, and overlapping explanations are not repeated below.

The semiconductor device according to the fourth embodiment, which has the configuration in which the semiconductor devices 3*a* and 3*b* are electrically connected to the printed circuit board 6 by the means other than the interposers, can also achieve the effects similar to those of the semiconductor device according to the third embodiment.

Fifth Embodiment

A semiconductor device according to a fifth embodiment differs from the semiconductor device according to the first embodiment in that the circuit configuration illustrated in FIG. 1 does not include either the resistor R1 in the snubber circuit 101 or the resistor R2 in the snubber circuit 102, but only includes the capacitors C1 and C2.

Figure 15:
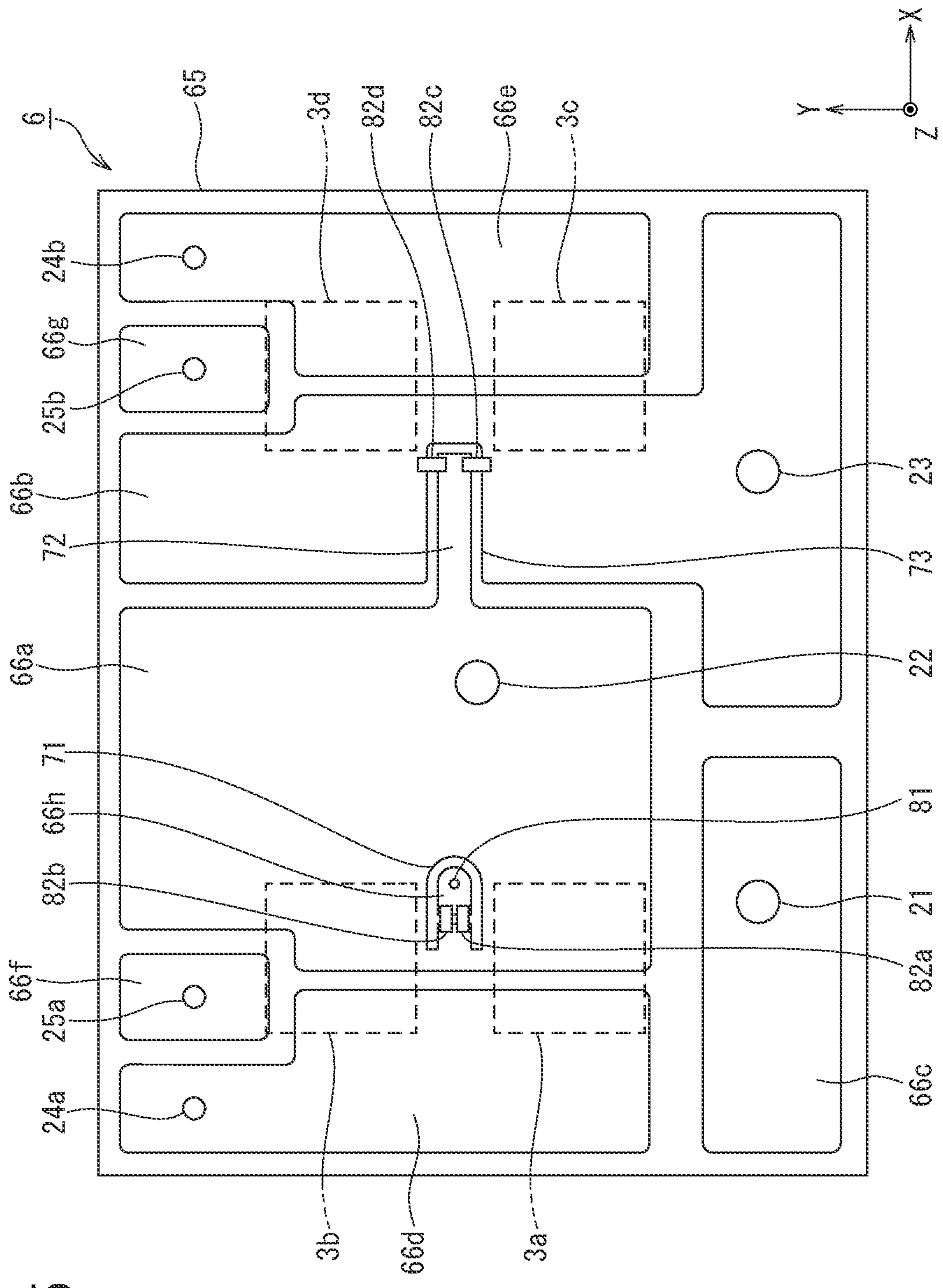
FIG. 15 is a plan view illustrating upper wiring layers of a printed circuit board according to a fifth embodiment.

The semiconductor device according to the fifth embodiment includes the capacitive elements 82*a* and 82*b* implementing the snubber circuit on the upper-arm side and the capacitive elements 82*c* and 82*d* implementing the snubber circuit on the lower-arm side that are arranged on the printed circuit board 6, as illustrated in FIG. 15. Each one end of the capacitive elements 82*a* and 82*b* is located on the upper wiring layer 66*h* so as to be electrically connected to the relay terminal 81 via the upper wiring layer 66*h*. Each of the other ends of the capacitive elements 82*a* and 82*b* is located on the upper wiring layer 66*a* so as to be electrically connected to the external connection terminal 22 via the upper wiring layer 66*a*.

Each one end of the capacitive elements 82*c* and 82*d* is located on the upper wiring layer 66*b* so as to be electrically connected to the external connection terminal 23 via the upper wiring layer 66*b*. Each of the other ends of the capacitive elements 82*c* and 82*d* is located on the upper wiring layer 66*a* so as to be electrically connected to the external connection terminal 22 via the upper wiring layer 66*a*.

The number of the capacitive elements mounted on the printed circuit board 6 in the semiconductor device according to the fifth embodiment can be changed as appropriate depending on the current rating and the structure of the module, or the characteristics of the device and the characteristics of the capacitive elements. The layout in the semiconductor device according to the fifth embodiment can also be changed as appropriate depending on the number of the capacitive elements to be mounted. The other configurations of the semiconductor device according to the fifth embodiment are the same as those of the semiconductor device according to the first embodiment, and overlapping explanations are not repeated below.

The semiconductor device according to the fifth embodiment, in which the snubber circuit on the upper-arm side is implemented only by the capacitive elements 82*a* and 82*b*, and the snubber circuit on the lower-arm side is implemented only by the capacitive elements 82*c* and 82*d*, can also achieve the effects similar to those of the semiconductor device according to the first embodiment.

Sixth Embodiment

A semiconductor device according to a sixth embodiment differs from the semiconductor device according to the second embodiment in that the snubber circuit 103 connected between the positive-electrode terminal P and the negative-electrode terminal N does not include the resistor R3 but only include the capacitor C3 in the circuit configuration illustrated in FIG. 11.

Figure 16:
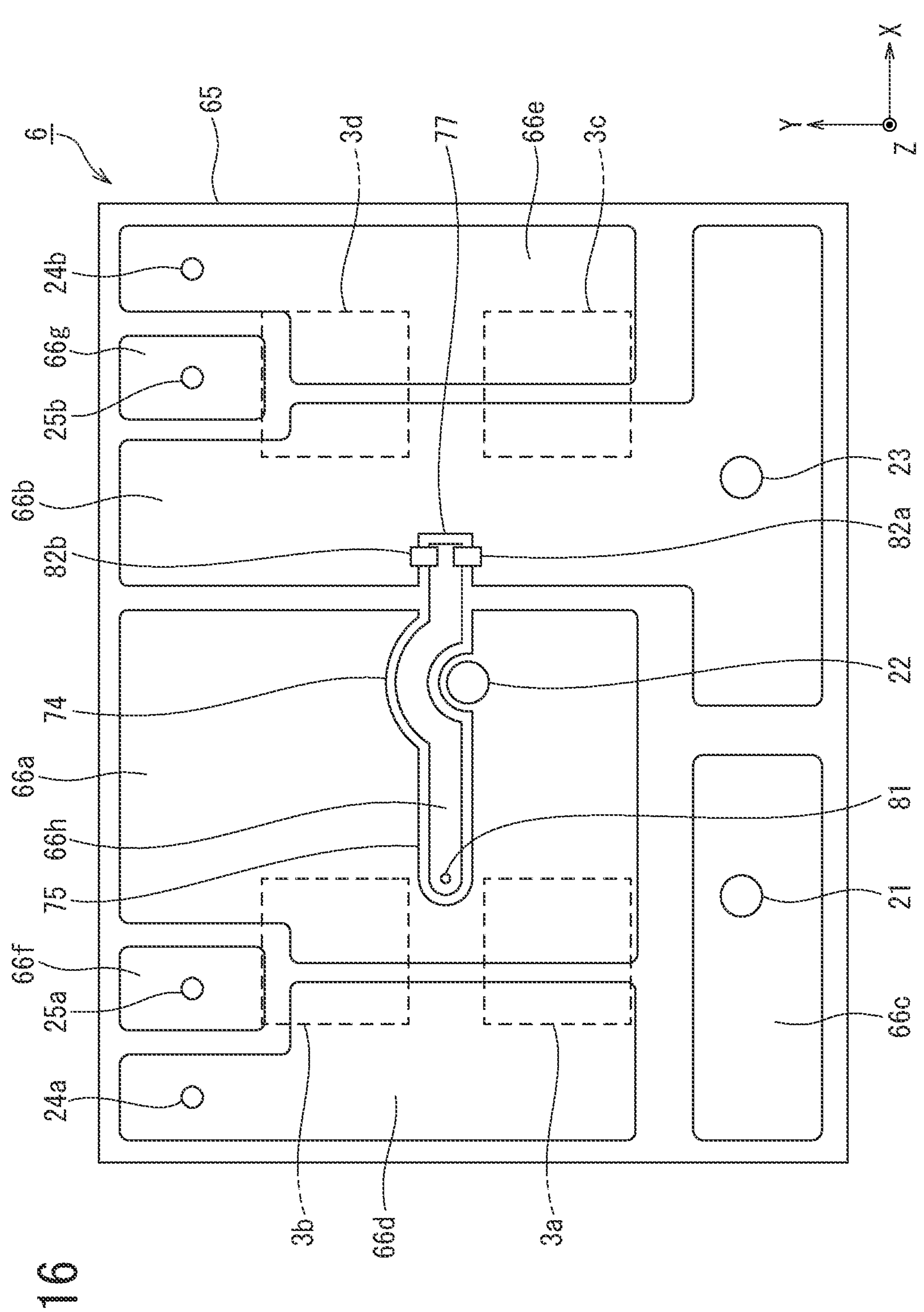
FIG. 16 is a plan view illustrating upper wiring layers of a printed circuit board according to a sixth embodiment.

The semiconductor device according to the sixth embodiment includes the capacitive elements 82*a* and 82*b* implementing the snubber circuit arranged on the printed circuit board 6, as illustrated in FIG. 16. Each one end of the capacitive elements 82*a* and 82*b* is located on the upper wiring layer 66*h* so as to be electrically connected to the relay terminal 81 via the upper wiring layer 66*h*. Each of the other ends of the capacitive elements 82*a* and 82*b* is located on the upper wiring layer 66*b* so as to be electrically connected to the external connection terminal 23 via the upper wiring layer 66*b*.

The number of the capacitive elements mounted on the printed circuit board 6 in the semiconductor device according to the sixth embodiment can be changed as appropriate depending on the current rating and the structure of the module, or the characteristics of the device and the characteristics of the capacitive elements. The layout in the semiconductor device according to the sixth embodiment can also be changed as appropriate depending on the number of the capacitive elements to be mounted. The other configurations of the semiconductor device according to the sixth embodiment are the same as those of the semiconductor device according to the second embodiment, and overlapping explanations are not repeated below.

The semiconductor device according to the sixth embodiment, in which the snubber circuit is implemented only by the capacitive elements 82*a* and 82*b*, can also achieve the effects similar to those of the semiconductor device according to the second embodiment. The semiconductor device according to the sixth embodiment may be configured such that the relay terminal 81 serves as a resistor so as to implement the snubber circuit (81, 82*a*, and 82*b*) that is a CR snubber by the relay terminal 81 and the capacitive elements 82*a* and 82*b*.

OTHER EMBODIMENTS

As described above, the invention has been described according to the first to sixth embodiments, but it should not be understood that the description and drawings implementing a portion of this disclosure limit the invention. Various alternative embodiments of the present invention, examples, and operational techniques will be apparent to those skilled in the art from this disclosure.

The configurations disclosed in the first to sixth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

The invention claimed is:

1. A semiconductor device comprising:

an insulated circuit substrate;

one or more semiconductor chips provided on the insulated circuit substrate;

a first external connection terminal provided on the insulated circuit substrate;

a relay terminal provided on the insulated circuit substrate;

a printed circuit board arranged over the one or more semiconductor chips and connected to the first external connection terminal and the relay terminal; and a first snubber circuit provided on the printed circuit board and having one end connected to the first external connection terminal via the printed circuit board and another end connected to the relay terminal via the printed circuit board.

2. The semiconductor device of claim 1, wherein the first snubber circuit includes one or more first resistive elements having one end connected to the first external connection terminal via the printed circuit board, and one or more first capacitive elements having one end connected to another end of the one or more first resistive elements via the printed circuit board and another end connected to the relay terminal via the printed circuit board.

3. The semiconductor device of claim 2, wherein two of the one or more first resistive elements are aligned in a parallel direction in which the one or more semiconductor chips are arranged in parallel at positions overlapping with a region interposed between the one or more semiconductor chips on the printed circuit board.

4. The semiconductor device of claim 2, wherein two of the one or more first capacitive elements are arranged parallel to each other in a direction orthogonal to a parallel direction in which the one or more semiconductor chips are arranged in parallel at positions overlapping with a region interposed between the one or more semiconductor chips on the printed circuit board.

5. The semiconductor device of claim 1, further comprising:

a second external connection terminal provided on the printed circuit board; and a second snubber circuit provided on the printed circuit board, and having one end connected to the first external connection terminal via the printed circuit board and another end connected to the second external connection terminal via the printed circuit board.

6. The semiconductor device of claim 5, wherein the second snubber circuit includes one or more second resistive elements having one end connected to the first external connection terminal via the printed circuit board, and one or more second capacitive elements having one end connected to another end of the one or more second resistive elements via the printed circuit board and another end connected to the second external connection terminal via the printed circuit board.

7. The semiconductor device of claim 6, wherein two of the one or more second resistive elements are arranged parallel to each other in a direction orthogonal to a parallel direction in which the one or more semiconductor chips are arranged in parallel at positions overlapping with a region distant from the one or more semiconductor chips with an equal distance on the printed circuit board.

8. The semiconductor device of claim 6, wherein two of the one or more second capacitive elements are aligned in a parallel direction in which the one or more semiconductor chips are arranged in parallel at positions overlapping with a region distant from the one or more semiconductor chips with an equal distance on the printed circuit board.

9. The semiconductor device of claim 1, wherein the first snubber circuit includes one or more capacitive elements having one end connected to the first external connection terminal via the printed circuit board, and a resistive element having one end connected to another end of the one or more capacitive elements via the printed circuit board and another end connected to the relay terminal via the printed circuit board.

10. The semiconductor device of claim 9, wherein two of the one or more capacitive elements are aligned in a parallel direction in which the one or more semiconductor chips are arranged in parallel at positions overlapping with a region distant from the one or more semiconductor chips with an equal distance on the printed circuit board.

11. The semiconductor device of claim 10, wherein the resistive element is arranged at a position distant from the two of the one or more capacitive elements with an equal distance.

12. The semiconductor device of claim 1, wherein the printed circuit board includes a first insulating layer, an upper wiring layer provided on a top surface side of the first insulating layer, and a lower wiring layer provided on a bottom surface side of the first insulating layer.

13. The semiconductor device of claim 12, wherein the printed circuit board further includes a first carbon layer provided on a bottom surface of the first insulating layer, and a second carbon layer arranged between a bottom surface of the first carbon layer and a top surface of the lower wiring layer.

14. The semiconductor device of claim 12, wherein the printed circuit board further includes a first carbon layer provided on a top surface of the upper wiring layer, and a second carbon layer provided on a bottom surface of the lower wiring layer.

15. The semiconductor device of claim 1, further comprising an interposer provided to connect the one or more semiconductor chips with the printed circuit board.

16. The semiconductor device of claim 1, wherein the one or more semiconductor chips include silicon carbide, gallium nitride, or gallium oxide.

17. A semiconductor device comprising:

an insulated circuit substrate;

a semiconductor chip provided on the insulated circuit substrate;

a first external connection terminal provided on the insulated circuit substrate;

a printed circuit board arranged over the semiconductor chip and connected to the first external connection terminal;

a second external connection terminal provided on the printed circuit board; and a snubber circuit provided on the printed circuit board and having one end connected to the first external connection terminal via the printed circuit board and another end connected to the second external connection terminal via the printed circuit board.

* * * * *